United States Patent
Nakamura et al.

(10) Patent No.: US 7,224,016 B2
(45) Date of Patent: May 29, 2007

(54) MEMORY WITH MEMORY CELLS THAT INCLUDE A MIM TYPE CAPACITOR WITH A LOWER ELECTRODE MADE FOR REDUCED RESISTANCE AT AN INTERFACE WITH A METAL FILM

(75) Inventors: Yoshitaka Nakamura, Tokyo (JP); Hidekazu Goto, Tokyo (JP); Isamu Asano, Tokyo (JP); Mitsuhiro Horikawa, Tokyo (JP); Keiji Kuroki, Tokyo (JP); Hiroshi Sakuma, Tokyo (JP); Kenichi Koyanagi, Tokyo (JP); Tsuyoshi Kawagoe, Tokyo (JP)

(73) Assignees: Elpida Memory, Inc., Tokyo (JP); Hitachi ULSI Systems, Co., Ltd., Tokyo (JP); Hitachi Ltd., Tokyo (JP)

( * ) Notice: Subject to any disclaimer, the term of this patent is extended or adjusted under 35 U.S.C. 154(b) by 48 days.

(21) Appl. No.: 10/777,704

(22) Filed: Feb. 13, 2004

(65) Prior Publication Data

US 2004/0248362 A1    Dec. 9, 2004

(30) Foreign Application Priority Data

Feb. 14, 2003   (JP) ............................. 2003-036459

(51) Int. Cl.
H01L 21/8242  (2006.01)

(52) U.S. Cl. ..................................... 257/306; 257/296

(58) Field of Classification Search ................ 257/295, 257/296, 306
See application file for complete search history.

(56) References Cited

U.S. PATENT DOCUMENTS

| 6,084,261 A * | 7/2000 | Wu .............................. 257/309 |
| 6,380,574 B1 * | 4/2002 | Torii et al. .................. 257/295 |
| 2002/0048870 A1 * | 4/2002 | Lane ........................... 438/186 |
| 2002/0052126 A1 * | 5/2002 | Lee et al. .................... 438/784 |
| 2003/0124812 A1 * | 7/2003 | Ahn et al. ................... 438/396 |

FOREIGN PATENT DOCUMENTS

| JP | 2002-83940 A | 3/2002 |
| JP | 2002-270794 A | 9/2002 |

* cited by examiner

*Primary Examiner*—Thomas L. Dickey
(74) *Attorney, Agent, or Firm*—Sughrue Mion, PLLC

(57) ABSTRACT

A semiconductor device includes memory cells each having an MISFET for memory selection formed on one major surface of a semiconductor substrate and a capacitive element comprised of a lower electrode electrically connected at a bottom portion to one of a source and drain of the MISFET for memory selection via a first metal layer and an upper electrode formed on the lower electrode via a capacitive insulating film. The lower electrode has a thickness of 30 nm or greater at the bottom portion thereof. Sputtering with a high ionization ratio and high directivity, such as PCM, is adapted to the formation of the lower electrode to make only the bottom portion of a capacitor thicker.

12 Claims, 21 Drawing Sheets

MEMORY WITH MEMORY CELLS THAT INCLUDE A MIM TYPE CAPACITOR WITH A LOWER ELECTRODE MADE FOR REDUCED RESISTANCE AT AN INTERFACE WITH A METAL FILM

This application claims priority to prior application JP 2003-36459, the disclosure of which is incorporated herein by reference.

BACKGROUND OF THE INVENTION (1) Field of the Invention

The present invention relates to a semiconductor device and a fabrication method therefor, and, more particularly, to an MIM (Metal Insulator Metal) type capacitor and a fabrication method therefor.

(2) Description of the Related Art

Each of memory cells of a DRAM (Dynamic Random Access Memory) comprises a selection transistor and a capacitor. As the micropatterning of memory cells becomes finer with the advancement of the microfabrication technology, the amount of electric charges stored in a capacitor undesirably becomes smaller. To solve this problem, active studies have been made on three-dimensional fabrication of a capacitor to increase the electrode area and transition of the capacitor structure from the MIS (Metal Insulator Silicon) structure to the MIM structure.

FIG. 1 is a longitudinal cross-sectional view showing a typical conventional MIM type capacitor. FIG. 2 is a longitudinal cross-sectional view showing one example of a memory cell having an MIM type capacitor.

In the memory cell shown in FIG. 2, two selection transistors are formed in active regions defined on the major surface of a silicon substrate 10 by an isolation insulating film 2 and each selection transistor comprises a gate electrode 4 formed on the major surface of the silicon substrate 10 via a gate insulating film 3, and a pair of diffusion layer regions 5 and 6 to be a source region and a drain region. The diffusion layer regions 5 of the individual selection transistors are shared as a single region.

In the selection transistor, a bit line 8 formed on interlayer insulating films 25 and 26 is connected to the mentioned one diffusion layer region 5 via a polysilicon plug 12 penetrating the interlayer insulating film 25 and a metal plug 7. The bit line 8 is covered with an interlayer insulating film 21. A capacitor is constructed by laminating a ruthenium film 41 as a lower electrode, a ruthenium film 61 as an upper electrode and a tantalum oxide film 51 as a capacitive insulating film in a hole provided in an interlayer insulating film 22 formed on the interlayer insulating film 21.

The lower electrode 41 is connected at its bottom to a barrier metal film 32 which is connected to a polysilicon plug 11 via a contact metal film 31. The polysilicon plug 11 is further connected to the diffusion layer region 6 of the transistor via the underlying polysilicon plug 12.

To improve the charge storage capacitance per unit electrode area by reducing the leak current of the tantalum oxide film 51 in the process of fabricating the capacitor, it is necessary to take a step of oxidizing the tantalum oxide film 51. As a side effect of the step, oxygen is diffused in the lower electrode (ruthenium film), thereby oxidizing the interface portion between the lower electrode 41 and the barrier metal film 32. In case where a titanium nitride film is used for the barrier metal film 32, a titanium oxide film is formed at the interface with the lower electrode 41 and leads to increasing the conductive resistance. Further, the volume expansion that also occurs due to the formation of the titanium oxide film brings about a problem of applying stress to the capacitor, thereby increasing the leak current of the capacitor.

One way of suppressing the diffusion of oxygen in the lower electrode is to make the lower electrode thicker. However, increasing the thickness of the lower electrode by CVD normally causes a film of the same thickness to grow on the side wall portion and the bottom portion. The increase in the thickness of the side wall portion causes a side effect of decreasing the inner circumferential length of the electrode to thereby reduce the amount of electric charges stored in the capacitor (FIG. 3).

As one way of reducing the amount of oxygen diffusion in the lower electrode while preventing the side effect, forming only the bottom portion of the lower electrode of a capacitor in a step separate from the step of forming the other portions of the lower electrode is described in Japanese Patent Laid-Open No. 2002-83940. This method has demonstrated an effect to some extent in suppressing the deterioration of the capacitor characteristic originated from the expansion of the volume of the barrier metal film at the bottom portion of the capacitor (FIG. 4).

However, the prior art illustrated in FIG. 4 has a problem that forming only the bottom portion of the hole in a step separate from the formation of the capacitor portion increases the number of required steps. In addition, since the prior art requires one additional step involving the photolithography technique as compared with the example illustrated in FIG. 1, the process margin for layer alignment becomes narrower.

SUMMARY OF THE INVENTION

It is therefore an object of the present invention to provide an MIM type capacitor in which a lower electrode is made thick only at its bottom portion and which is capable of reducing the number of fabrication processes and securing the alignment margin, and a fabrication method for the capacitor.

It is another object of the invention to provide an MIM type capacitor in which an interface between a lower electrode and a barrier metal film is not oxidized and which has a small leak current and a low conductive resistance.

It is a further object of the invention to provide an MIM type capacitor which reduces the resistance at the interface between its lower electrode and barrier metal film by increasing the process margin for layer alignment, and a fabrication method for the capacitor.

To achieve the objects, according to the first aspect of the invention, there is provided a semiconductor device comprising memory cells each having an MISFET for memory selection formed on one major surface of a semiconductor substrate and a capacitive element comprised of a lower electrode electrically connected at a bottom portion to one of a source and drain of the MISFET for memory selection via a first metal layer and an upper electrode formed on the lower electrode via a capacitive insulating film, wherein the lower electrode has a thickness of 30 nm or greater at the bottom portion thereof.

According to the second aspect of the invention, there is provided a semiconductor device comprising memory cells each having an MISFET for memory selection formed on one major surface of a semiconductor substrate and a capacitive element comprised of a lower electrode electrically connected at a bottom portion to one of a source and drain of the MISFET for memory selection via a first metal layer and an upper electrode formed on the lower electrode via a capacitive insulating film, wherein the lower electrode has a shape of cups provided along side walls and bottoms of holes provided in an interlayer insulating film and has a thickness of 30 nm or greater at the bottom portion thereof.

According to the third aspect of the invention, there is provided a semiconductor device comprising memory cells each having an MISFET for memory selection formed on one major surface of a semiconductor substrate and a capacitive element comprised of a lower electrode electrically connected at a bottom portion to one of a source and drain of the MISFET for memory selection via a first metal layer and an upper electrode formed on the lower electrode via a capacitive insulating film, wherein the lower electrode has a shape of cups provided along side walls and bottoms of holes provided in an interlayer insulating film and has a thickness of 30 nm or greater at the bottom portion thereof and a thickness of at least 30 nm or less at a side portion thereof.

According to the fourth aspect of the invention, there is provided a semiconductor device comprising memory cells each having an MISFET for memory selection formed on one major surface of a semiconductor substrate and a capacitive element comprised of a lower electrode electrically connected at a bottom portion to one of a source and drain of the MISFET for memory selection via a first metal layer and an upper electrode formed on the lower electrode via a capacitive insulating film, wherein the lower electrode has a columnar shape having a cavity in a center portion thereof, and a minimum distance between the cavity and the first metal layer is 30 nm or greater.

It is preferable that the lower electrode should have a thickness of 30 nm or greater at least at that portion which contacts the first metal layer.

It is preferable that at that portion of the lower electrode which contacts the first metal layer, there should be at most three grain boundaries penetrating the lower electrode in a direction of thickness.

It is preferable that a crystal of the lower electrode at that portion of the lower electrode which contacts the first metal layer should have at least 70% of a (002) orientation.

According to the fifth aspect of the invention, there is provided a semiconductor device comprising memory cells each having an MISFET for memory selection formed on one major surface of a semiconductor substrate and a capacitive element comprised of a lower electrode electrically connected at a bottom portion to one of a source and drain of the MISFET for memory selection via a first metal layer and a second metal layer and an upper electrode formed on the lower electrode via a capacitive insulating film, wherein the lower electrode has a shape of cups provided along side walls and bottoms of holes provided in an interlayer insulating film, the first metal layer and the second metal layer partly contact each other, the lower electrode is connected at an entire bottom thereof to the second metal layer and the lower electrode has a thickness of 30 nm or greater at the bottom portion thereof.

According to the sixth aspect of the invention, there is provided a semiconductor device comprising memory cells each having an MISFET for memory selection formed on one major surface of a semiconductor substrate and a capacitive element comprised of a lower electrode electrically connected at a bottom portion to one of a source and drain of the MISFET for memory selection via a first metal layer and a second metal layer and an upper electrode formed on the lower electrode via a capacitive insulating film, wherein the lower electrode has a shape of cups provided along side walls and bottoms of holes provided in an interlayer insulating film, the first metal layer and the second metal layer partly contact each other, the lower electrode is connected at an entire bottom thereof to the second metal layer and the lower electrode has a thickness of 30 nm or greater at the bottom portion thereof and a thickness of at least 30 nm or less at a side portion thereof.

According to the seventh aspect of the invention, there is provided a semiconductor device comprising memory cells each having an MISFET for memory selection formed on one major surface of a semiconductor substrate and a capacitive element comprised of a lower electrode electrically connected at a bottom portion to one of a source and drain of the MISFET for memory selection via a first metal layer and a second metal layer and an upper electrode formed on the lower electrode via a capacitive insulating film, wherein the first metal layer and the second metal layer partly contact each other, the lower electrode is connected at an entire bottom thereof to the second metal layer, the lower electrode has a columnar shape having a cavity in a center portion thereof and a minimum distance between the cavity and the second metal layer is 30 nm or greater According to the eighth aspect of the invention, there is provided a fabrication method for a semiconductor device comprising memory cells each having an MISFET for memory selection formed on one major surface of a semiconductor substrate and a capacitive element comprised of a lower electrode electrically connected at a bottom portion to one of a source and drain of the MISFET for memory selection via a first metal layer and an upper electrode formed on the lower electrode via a capacitive insulating film, the method having a step of forming an interlayer insulating film on the first metal layer; a step of boring a hole in the interlayer insulating film to expose the first metal layer at a bottom portion of the hole; a step of forming the lower electrode whose thickness at that portion which contacts the first metal layer at that portion which contacts the first metal layer is greater than a thickness of the other portion; a step of forming the capacitive insulating film; a step of reforming the capacitive insulating film; and a step of forming the upper electrode.

According to the ninth aspect of the invention, there is provided a fabrication method for a semiconductor device comprising memory cells each having an MISFET for memory selection formed on one major surface of a semiconductor substrate and a capacitive element comprised of a lower electrode electrically connected at a bottom portion to one of a source and drain of the MISFET for memory selection via a first metal layer and an upper electrode formed on the lower electrode via a capacitive insulating film, the method having a step of forming an interlayer insulating film on the first metal layer; a step of boring a hole in the interlayer insulating film to expose the first metal layer at a bottom portion of the hole; a step of forming the lower electrode whose thickness at that portion which contacts the first metal layer at that portion which contacts the first metal layer is greater than a thickness of the other portion; a step of forming the capacitive insulating film; a step of reforming the capacitive insulating film; and a step of forming the upper electrode.

According to the tenth aspect of the invention, there is provided a fabrication method for a semiconductor device comprising memory cells each having an MISFET for memory selection formed on one major surface of a semiconductor substrate and a capacitive element comprised of a lower electrode having a columnar shape having a cavity in a center portion thereof and electrically connected at a bottom portion to one of a source and drain of the MISFET for memory selection via a first metal layer and an upper electrode formed on the lower electrode via a capacitive insulating film, the method having a step of forming an interlayer insulating film on the first metal layer; a step of boring a hole in the interlayer insulating film to expose the first metal layer at a bottom portion of the hole; a step of forming the lower electrode Which satisfies a relationship of (a minimum distance between the cavity in the lower electrode and the first metal layer) $\geq 30$ nm; a step of forming the capacitive insulating film; a step of reforming the capacitive insulating film; and a step of forming the upper electrode.

According to the eleventh aspect of the invention, there is provided a fabrication method for a semiconductor device which comprises memory cells each having an MISFET for memory selection formed on one major surface of a semiconductor substrate and a capacitive element comprised of a lower electrode electrically connected at a bottom portion to one of a source and drain of the MISFET for memory selection via a first metal layer and a second metal layer and an upper electrode formed on the lower electrode via a capacitive insulating film in which the first metal layer and the second metal layer partly contact each other and the second metal layer partly contacts the lower electrode, the method having a step of forming an interlayer insulating film on the first metal layer; a step of boring a hole in the interlayer insulating film to expose the first metal layer at a bottom portion of the hole; a step of forming the second metal layer in the bottom portion of the hole; a step of forming the lower electrode; a step of forming the capacitive insulating film; a step of reforming the capacitive insulating film; and a step of forming the upper electrode.

The invention is characterized by adapting sputtering with high ionization and high directivity, such as PCM (Point Cusp Magnetron), to the formation of the lower electrode to make only the bottom portion of the lower electrode thicker. PCM is sputtering to enhance the ionization and directivity of sputtered particles by using high-density plasma generated by controlling the magnetic field. PCM is also used in depositing a copper-plated seed layer of a copper wire and a barrier metal film (tantalum film, titanium nitride film).

The invention is also characterized in that at that portion of the lower electrode which contacts the first metal layer, there are at most three grain boundaries per bit penetrating the electrode film at the bottom portion of the lower electrode in the direction of thickness.

A further feature of the invention lies in that the (002) orientation of the electrode film at the bottom portion of the lower electrode is 70% or greater.

The invention provides an MIM type capacitor whose lower electrode is made thick only at its bottom portion without increasing the number of fabrication processes and reducing the process margin for layer alignment. The interface between the lower electrode and barrier metal film of the acquired MIM type capacitor is not oxidized and the capacitor has a small leak current and a low conductive resistance.

The invention is further characterized in the structure where a second barrier metal film of the same material as the first barrier metal film is laminated on the bottom portion of the lower electrode. The invention can therefore reduce the resistance at the interface between the lower electrode and barrier metal film by increasing the process margin for layer alignment.

DESCRIPTION OF THE PREFERRED EMBODIMENTS

Now, description will be made of preferred embodiments of the present invention in detail with reference to the accompanying drawings.

First Embodiment (1) Structure

Figure 5:
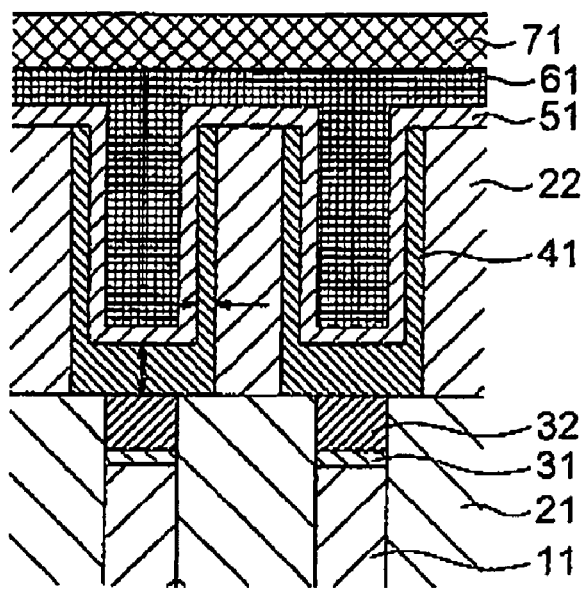
FIG. 5 is a longitudinal cross-sectional view showing illustrating a capacitor according to a first embodiment of the present invention.

FIG. 5 is a longitudinal cross-sectional view showing illustrating a capacitor according to the first embodiment of the present invention.

The capacitor according to the embodiment is formed on an interlayer insulating film 21 which covers an underlying device. The capacitor is constructed by laminating a ruthenium film 41 as a lower electrode, a ruthenium film 61 as an upper electrode and a tantalum oxide film 51 as a capacitive insulating film in a hole provided in an interlayer insulating film 22 formed on the interlayer insulating film 21.

Figure 1:
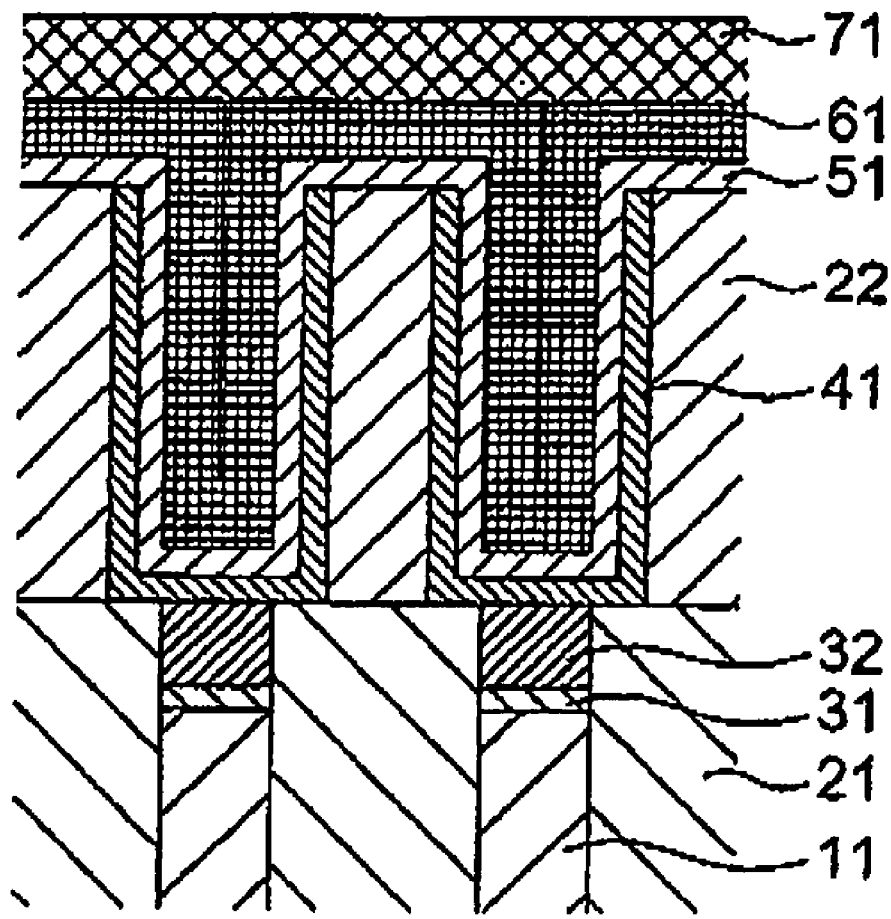
FIG. 1 is a longitudinal cross-sectional view showing a typical conventional MIM type capacitor.
Figure 2:
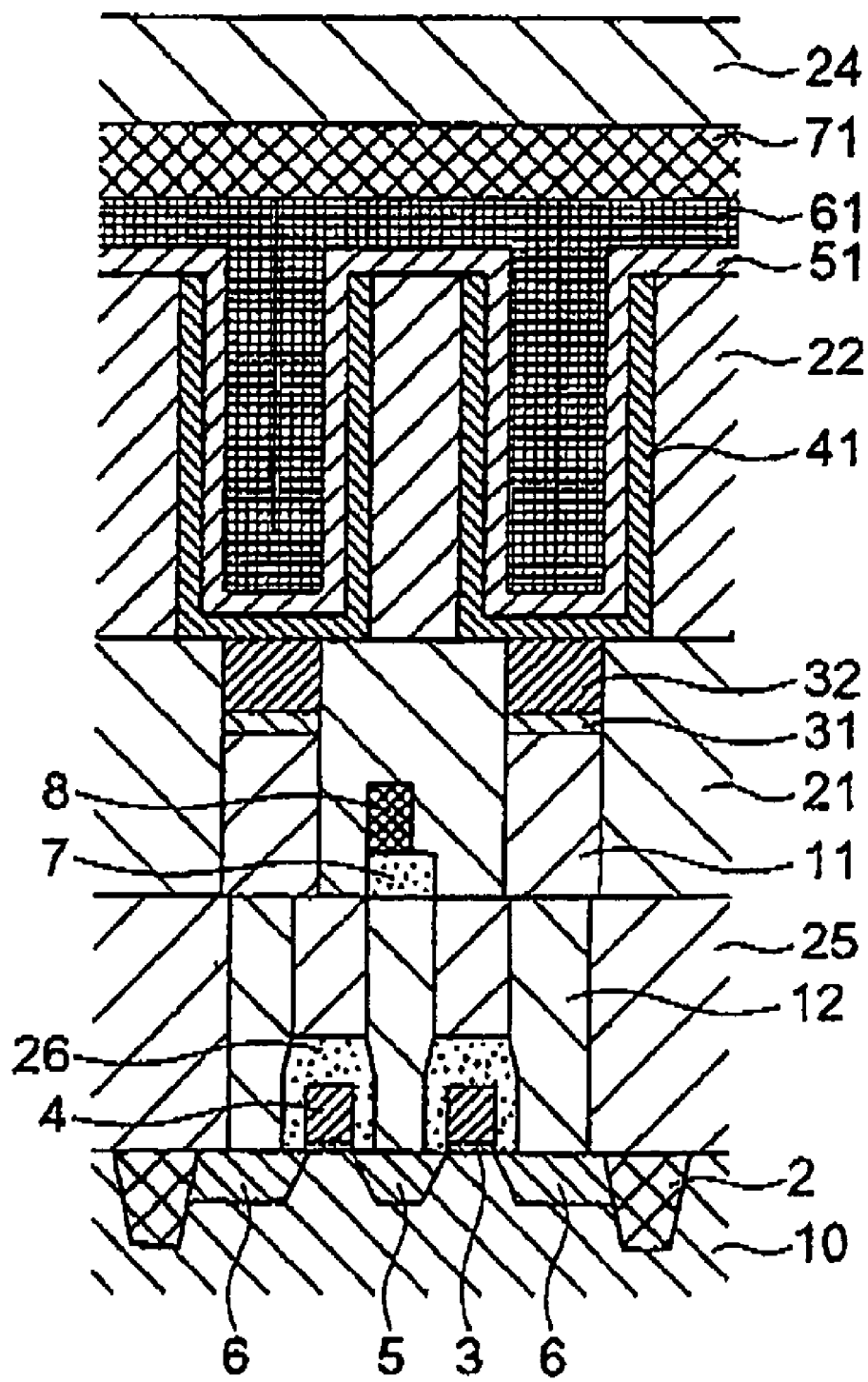
FIG. 2 is a longitudinal cross-sectional view showing one example of a memory cell having a conventional MIM type capacitor.
Figure 3:
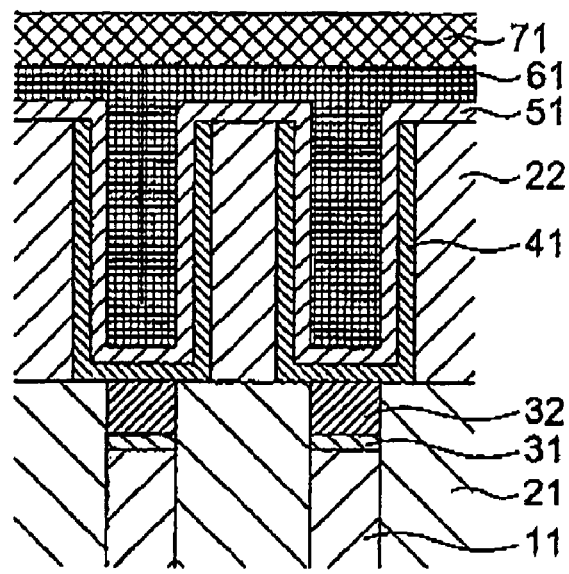
FIG. 3 is a longitudinal cross-sectional view showing a conventional MIM type capacitor.
Figure 4:
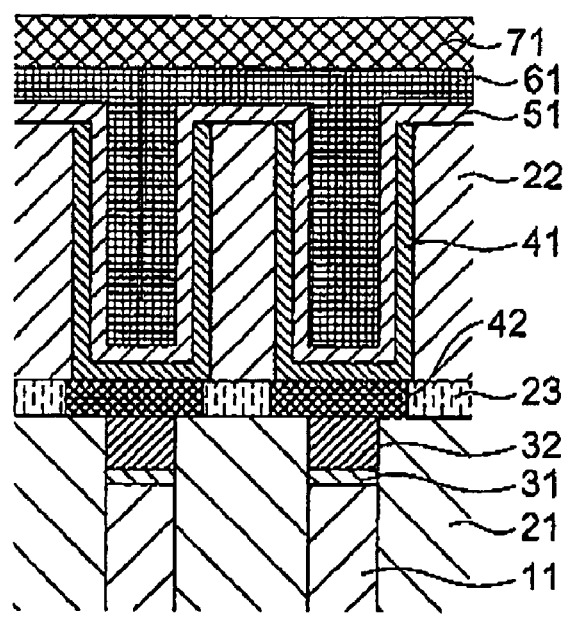
FIG. 4 is a longitudinal cross-sectional view showing another conventional MIM type capacitor.

The lower electrode 41 is connected at its bottom to a barrier metal film 32 which is connected at its bottom surface to a polysilicon plug 11 via a contact metal film 31. The polysilicon plug 11 is further connected to a diffusion layer region (equivalent to "6" in FIG. 2) via an underlying polysilicon plug (equivalent to "12" in FIG. 2).

In the embodiment, as the bottom portion of the lower electrode 41 is thicker than the side portion (shown in arrows in FIG. 5), the diffusion of oxygen is sufficiently suppressed, which does not raise problems of increasing the leak current and increasing the conductive resistance of the lower electrode and barrier metal film 32.

(2) Fabrication Method

A fabrication method for the capacitor shown in FIG. 5 is described using FIGS. 6 to 16.

Figure 6:
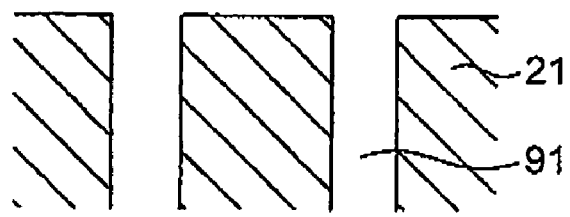
FIG. 6 is a longitudinal cross-sectional view illustrating one process of a fabrication method for the capacitor according to the first embodiment of the invention.
Figure 7:
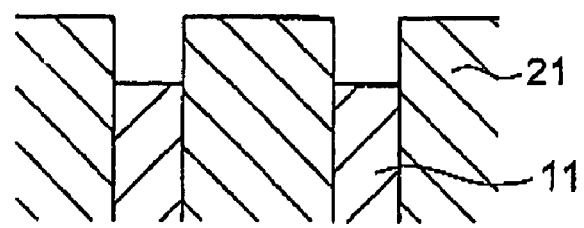
FIG. 7 is a longitudinal cross-sectional view illustrating another process of the fabrication method for the capacitor according to the first embodiment of the invention.

First, a contact hole 91 is bored through the interlayer insulating film 21 (FIG. 6). After the contact hole 91 is buried with a polysilicon film, the polysilicon film is etched back to form the polysilicon plug 11 (FIG. 7).

Figure 8:
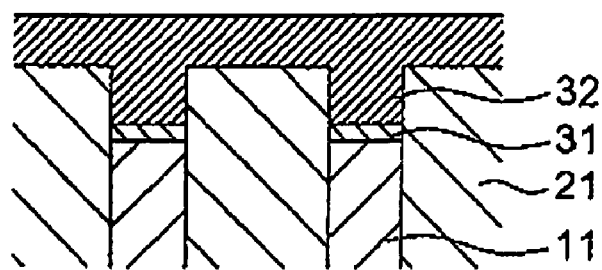
FIG. 8 is a longitudinal cross-sectional view illustrating a further process of the fabrication method for the capacitor according to the first embodiment of the invention.

A titanium silicide film 31 as a contact metal film and a titanium nitride film 32 as a barrier metal film are formed on the recessed portion of the top surface of the polysilicon plug 11 (FIG. 8). In order to form the titanium silicide film 31, a titanium film of 10 nm thick is deposited on the hole by sputtering after which a titanium silicide film is formed at the recessed bottom portion by a heat treatment in a nitrogen atmosphere at 700° C. and the titanium film on the recessed side portion is transformed to a titanium nitride film at the same time. The reason why the titanium film on the recessed side portion is transformed to the titanium nitride film is to prevent the titanium film from being oxidized in the later oxidization of the tantalum oxide film. (The titanium film is oxidized very easily as compared with the titanium nitride film.)

Subsequently, the barrier metal film outside the recess is removed by CMP (Chemical Mechanical Polishing) (FIG.

Figure 10:
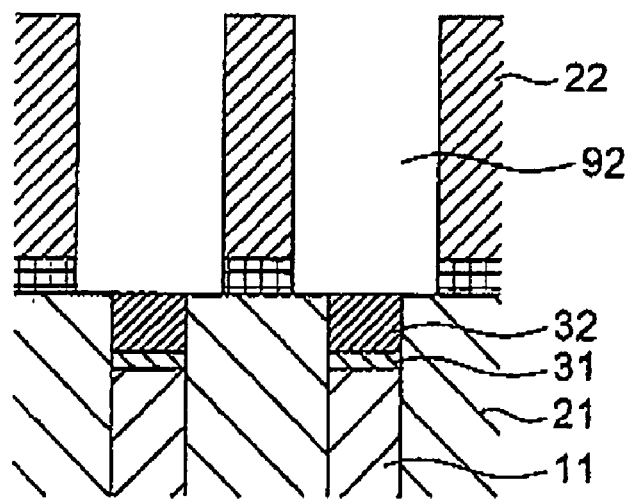
FIG. 10 is a longitudinal cross-sectional view illustrating a yet still further process of the fabrication method for the capacitor according to the first embodiment of the invention.

9). Next, the interlayer insulating film 22 is formed, and a cylinder hole 92 penetrating the interlayer insulating film 22 is formed to expose the top surface of the barrier metal film 32 at the bottom portion of the cylinder hole 92 (FIG. 10).

Figure 11:
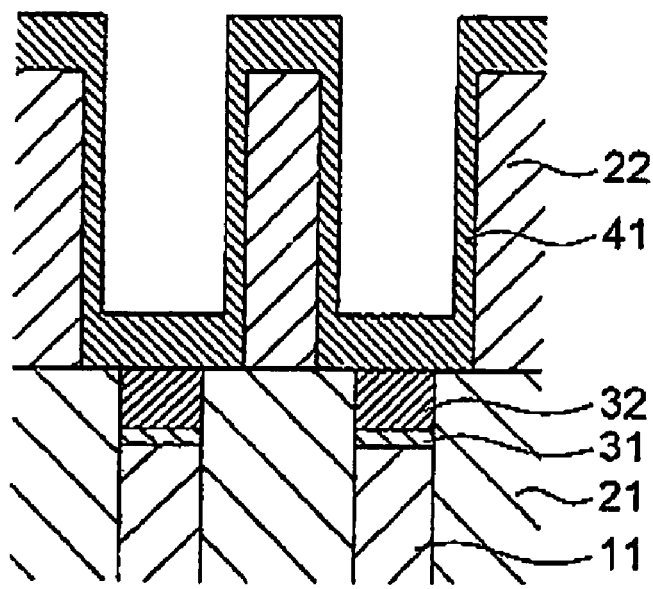
FIG. 11 is a longitudinal cross-sectional view illustrating a yet still further process of the fabrication method for the capacitor according to the first embodiment of the invention.
Figure 12:
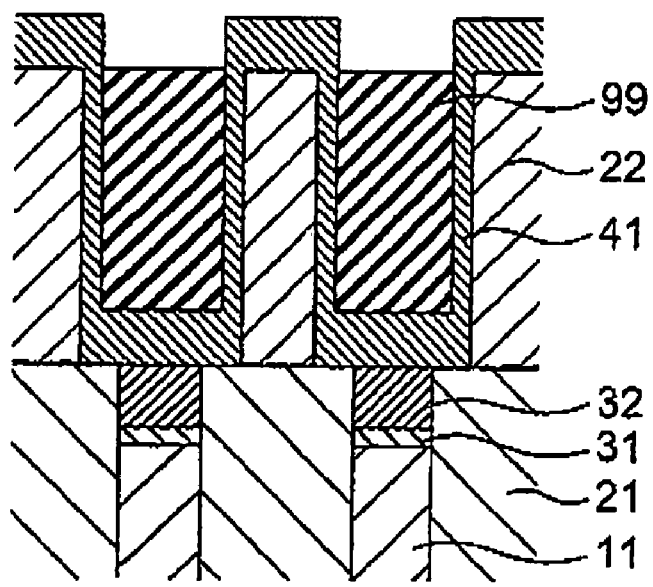
FIG. 12 is a longitudinal cross-sectional view illustrating a yet still further process of the fabrication method for the capacitor according to the first embodiment of the invention.
Figure 13:
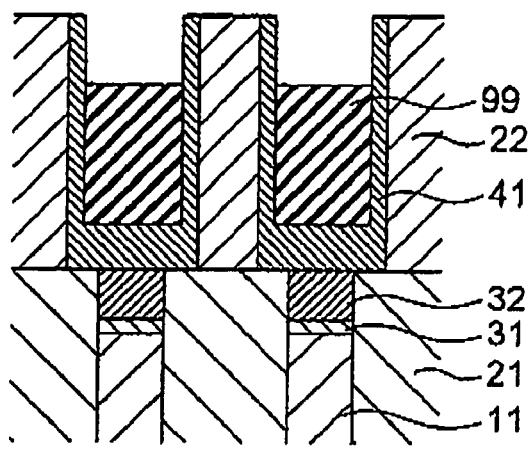
FIG. 13 is a longitudinal cross-sectional view illustrating a yet still further process of the fabrication method for the capacitor according to the first embodiment of the invention.

Then, the ruthenium film 41 is formed as a lower electrode by sputtering and CVD (Chemical Vapor Deposition) (FIG. 11). In this process, first, a ruthenium film of 20 nm thick is formed on the hole by PCM sputtering. At this time, a ruthenium film of 10 nm thick is formed on the bottom portion of the hole and a very thin (<1 nm) ruthenium film is formed on the side portion of the hole.

The formation of the ruthenium film by PCM is carried out under the conditions of the total pressure of 15 Pa, the argon flow rate of 110 sccm, RF power of 2000 W at 60 MHz and the deposition temperature of 300° C. Then, a ruthenium film is formed by CVD. In this event, a thin ruthenium film formed on the hole's side portion by sputtering serves as a seed layer and a ruthenium film of 20 nm thick is uniformly grown on the hole and the side portion and bottom portion of the hole.

The formation of the ruthenium film by CVD is carried out by using ethylcyclopentadienyl ruthenium (Ru $(C_2H_5C_5H_4)_2$) and oxygen as source gases and under the conditions of the deposition temperature of 320° C. and the total pressure of 400 Pa. The sputtering and CVD processes form a ruthenium film of 30 nm thick on the hole's bottom portion and a ruthenium film of 20 nm thick on the hole's side portion.

Figure 14:
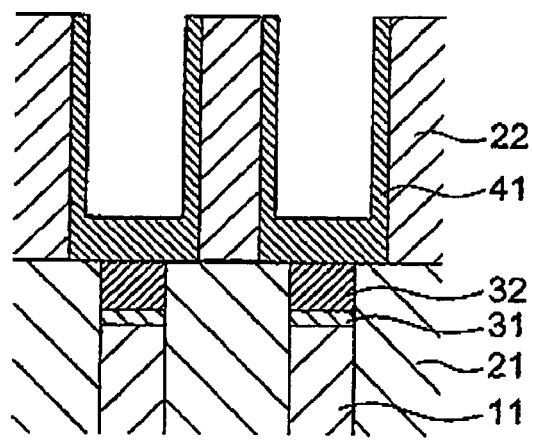
FIG. 14 is a longitudinal cross-sectional view illustrating a yet still further process of the fabrication method for the capacitor according to the first embodiment of the invention.

Next, a host resist film 99 is formed in the hole (FIG. 12) to protect the ruthenium film in the hole, the ruthenium film on the hole is etched back (FIG. 13), and the host resist film 99 is removed to obtain the cup-shaped lower electrode 41 (FIG. 14). Then, a heat treatment is carried out in a hydrogen atmosphere (nitrogen dilution of 20%) in order to improve the orientation of the ruthenium film 41.

Figure 15:
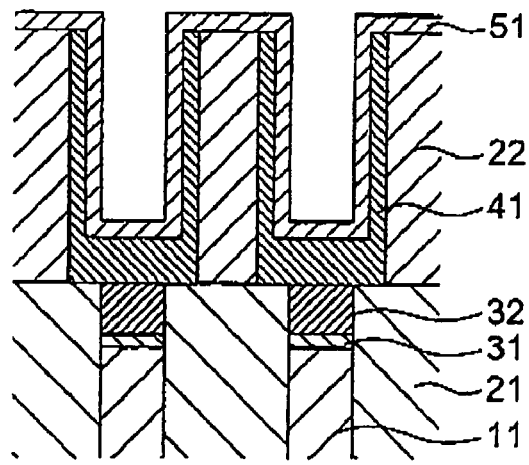
FIG. 15 is a longitudinal cross-sectional view illustrating a yet still further process of the fabrication method for the capacitor according to the first embodiment of the invention.

Next, the tantalum oxide film 51 of 15 nm thick is formed by CVD and a heat treatment to reform the tantalum oxide film 51 is performed (FIG. 15). This heat treatment is carried out in an ozone atmosphere at 410° C. for 10 minutes. The reason for the execution of the heat treatment in an ozone atmosphere is that ozone has stronger oxidation power than other oxidative gases, such as oxygen and nitrogen oxide and can sufficiently reform the tantalum oxide film.

It is desirable that the temperature for the heat treatment is within the range of 360° C. or higher but 460° C. or lower. If a temperature is lower than 360° C., the tantalum oxide film cannot be reformed sufficiently. On the other hand, if a temperature is higher than 460° C., the ruthenium film of the lower electrode is oxidized. Thus, the leak current of the capacitor is increased in either case.

Next, the ruthenium film 61 is formed as the upper electrode by sputtering and CVD, and a tungsten film 71 is formed on the ruthenium film 61 by sputtering to reduce the resistance of the upper electrode. The ruthenium film 61 and the tungsten film 71 are processed into a desired upper electrode pattern by photolithography and dry etching, thereby completing the capacitor with the structure shown in FIG. 5.

The fabrication method according to the first embodiment involves three processes that require photolithography and dry etching, namely, the boring of the contact hole, the boring of the cylinder hole for the lower electrode and the processing of the upper electrode, one process less than the prior art. Further, as the number of photoalignment processes is also reduced, so that the area secured for alignment margin can be made smaller, thus making it possible to reduce the chip area.

Although a titanium nitride film is used as a barrier metal film in the first embodiment, a tantalum nitride film, a tungsten nitride film, a tungsten silicide nitride (WSiN) film, a tantalum silicide nitride (TaSiN) film, a titanium silicide nitride (TiSiN) film, a titanium aluminum nitride (TiAlN) film or so may be used instead.

Further, platinum (Pt), iridium (Ir), a ruthenium oxide film or an iridium oxide film may be used for the lower electrode and the upper electrode in place of the ruthenium film. Furthermore, an aluminum oxide film a strontium titanium oxide (STO) film, a barium strontium titanium oxide (BST) film, a hafnium oxide film, a hafnium silicate oxide film or so may be used for the capacitive insulating film instead of the tantalum oxide film.

(3) Evaluation of Characteristic and Analysis Result

The evaluation of the characteristic and results of analysis of the capacitor described in the sections (1) and (2) are described in detail. The experimental conditions to be discussed below conform to the conditions for the fabrication method for the capacitor unless otherwise specified.

Figure 16:
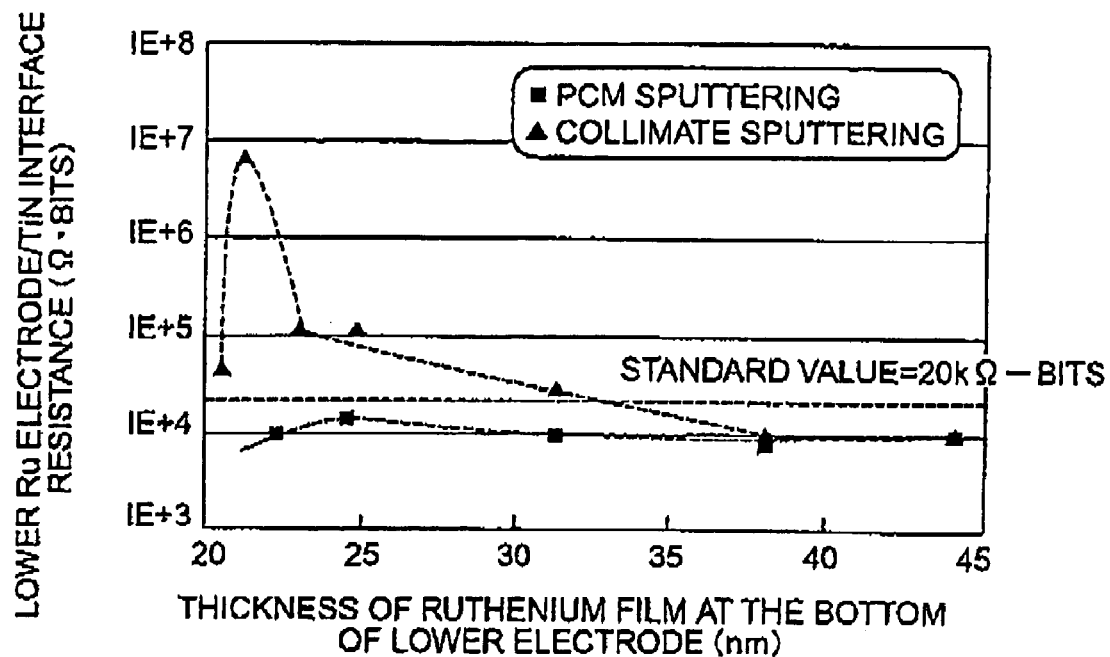
FIG. 16 is a diagram of experimental results showing the dependency of a conductive resistance on the thickness of a ruthenium film at the bottom portion of a lower electrode.

FIG. 16 shows the conductive resistance of the lower electrode and barrier metal film as a function of the thickness of the ruthenium film at the bottom portion of the lower electrode. In FIG. 16, the black triangles in FIG. 16 show the results of using collimate sputtering at the time of forming the ruthenium film of the lower electrode and the black rectangles show the results of using PCM sputtering at the time of forming the ruthenium film of the lower electrode.

Figure 17:
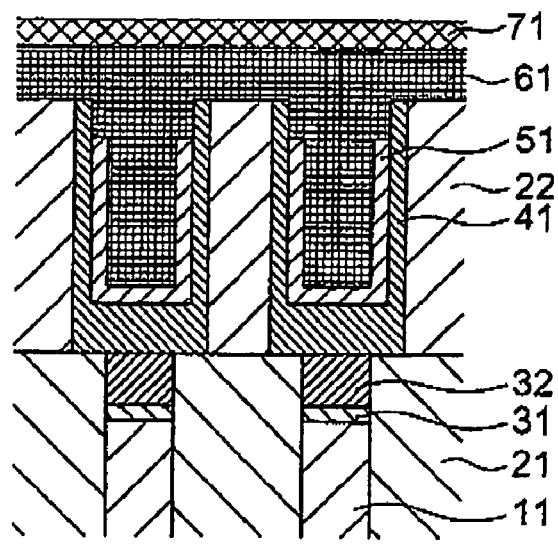
FIG. 17 is a longitudinal cross-sectional view of a sample used in evaluating the conductive resistance.

A sample with a structure wherein a process of etching back the tantalum oxide film 51 to short-circuit the upper electrode 61 and the lower electrode 41 is added after reforming the tantalum oxide film in the fabrication process for the capacitor was used in evaluating the conductive resistance (FIG. 17). The conductive resistance indicates a value when a voltage of 0.5 V is applied to the upper electrode 61 and the polysilicon plug 11. The specification of the conductive resistance was set to be equal to or lower than the ON resistance of the transistor of a memory cell of a DRAM, i.e., 20 kΩ·bits or lower. In case of using collimate sputtering, the conductive resistance became 20 kΩ·bits or lower when the thickness of the ruthenium film at the bottom portion of the lower electrode was 30 nm or greater. In case of using PCM sputtering, by contrast, the conductive resistance became 20 kΩ·bits or lower for all the thickness ranges tried in the experiment.

Figure 18:
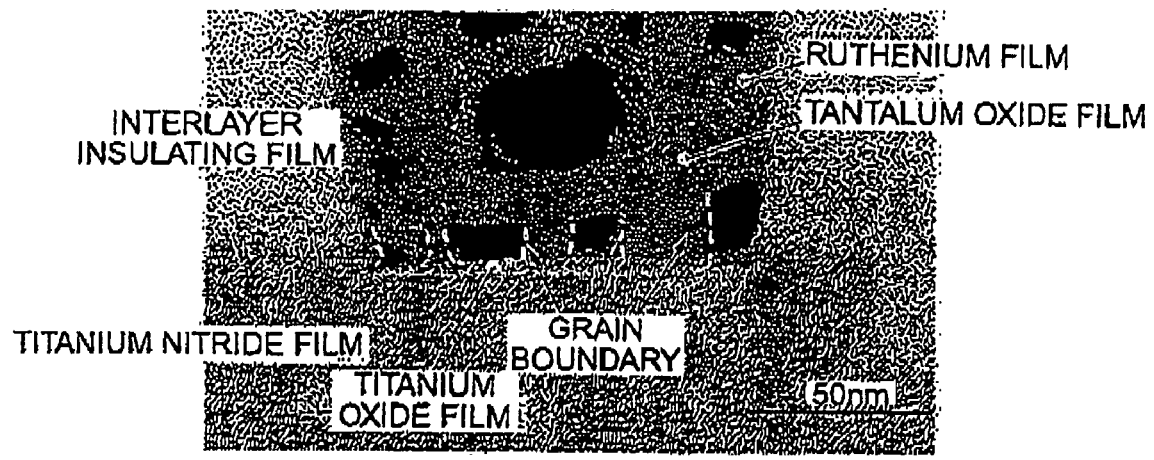
FIG. 18 is a diagram showing the results of TEM observation of the cross section of the bottom portion of the lower electrode.
Figure 19:
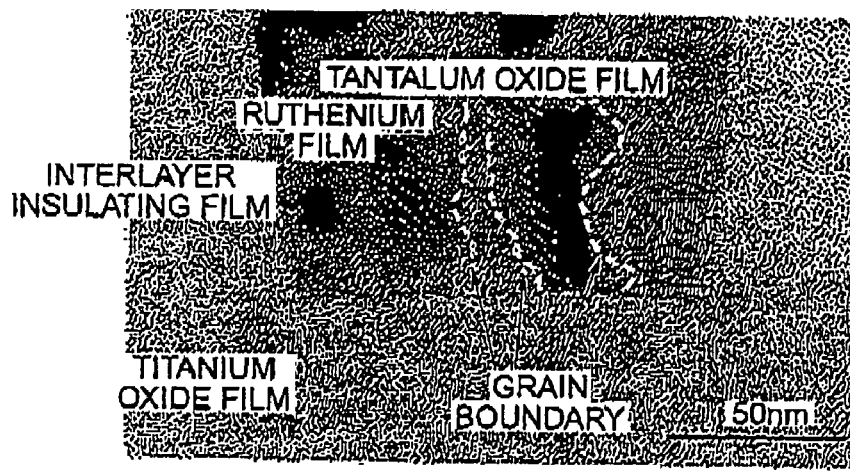
FIG. 19 is a diagram showing the results of TEM observation of the cross section of the bottom portion of the lower electrode.
Figure 30:
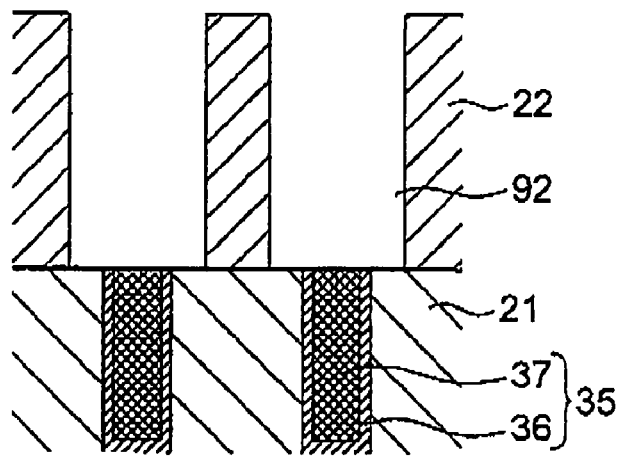
FIG. 30 is a longitudinal cross-sectional view illustrating one process of a fabrication method for the capacitor according to the third embodiment of the invention.

FIGS. 18 and 19 show the results of TEM (Transmission Electron Microscope) observation of the cross section of the bottom portion of the lower electrode. FIG. 18 shows the results when using collimate sputtering and FIG. 19 shows the results when using PCM sputtering, both being the results of observing the cross section including the diameter of the bottom portion of the lower electrode. A sample so constructed as to have a barrier metal film on the entire surface was used in the TEM cross-sectional observation (FIG. 30).

In case where collimate sputtering is used, there are seven grain boundaries penetrating the ruthenium film at the bottom portion of the lower electrode in the direction of thickness (FIG. 18). Further, a titanium oxide film is seen at the interface between the ruthenium film and the titanium nitride (barrier metal) film. The factors for the results seem to be that the titanium oxide film has a high electric resistance and the conductive resistance between the ruthenium film and the titanium nitride film is high.

In case where PCM sputtering is used, on the other hand, there are three grain boundaries penetrating the ruthenium film (FIG. 19). Further, there is no titanium oxide film seen at the interface between the ruthenium film and the titanium nitride film. Checking various sputtering types and conditions (deposition temperature and pressure), it is found out that the conductive resistance depends on the thickness of the ruthenium film at the bottom portion of the lower electrode and the grain-boundary density, as shown in FIG. 21.

Figure 21:
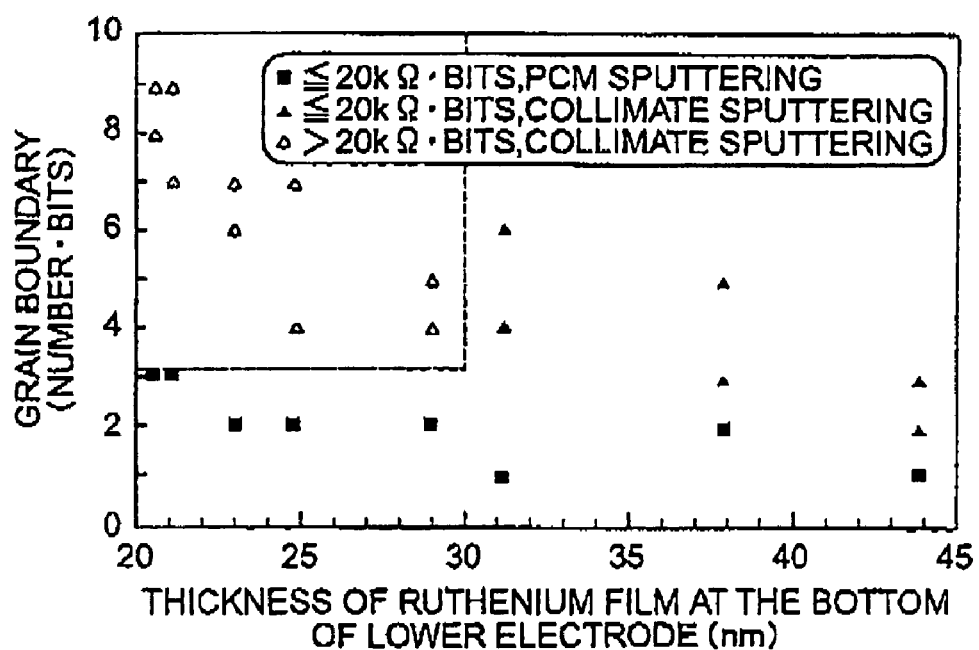
FIG. 21 is a diagram of experimental results showing the dependency of the conductive resistance on the thickness of a ruthenium film and grain boundary.

In FIG. 21, the white triangles indicate the conditions under which the conductive resistance becomes greater than 20 kΩ·bits, and the black rectangles and black triangles indicate the conditions under which the conductive resistance is 20 kΩ·bits or lower. In the diagram, the black rectangles indicate the case where PCM sputtering is used, while the black triangles and white triangles indicate the case where collimate sputtering is used.

Referring to FIG. 21, in case where the thickness of the ruthenium film at the bottom portion of the lower electrode is 30 nm or greater, the conductive resistance becomes 20 kΩ·bits or lower, Even in case where the thickness of the ruthenium film at the bottom portion of the lower electrode is 30 nm or less, the conductive resistance becomes 20 kΩ·bits or lower if the grain-boundary density is three boundaries per bit or less.

That the conductive resistance can be expressed in association with the thickness of the ruthenium film and the grain-boundary density can be explained from the fact that in general, diffusion of oxygen in a metal layer occurs through the grain boundary. Specifically, diffusion of oxygen through the ruthenium film is suppressed more as the thickness of the ruthenium film is thicker or the grain-boundary density is lower. In this case, a titanium oxide film is not formed and the conductive resistance is kept low.

Next, the orientation of the ruthenium film at the bottom portion of the lower electrode was checked by the electron beam diffraction method. The check result showed some correlation between the conductive resistance and the orientation of the ruthenium film. While (002), (100) and (101) are the major orientations of the ruthenium film, the conductive resistance becomes lower as the (002) orientation is greater in the direction of thickness. Here, the (002) orientation is defined as follows:

(002) orientation $I(002)/(I(002)+I(100)+I(101))$.

Figure 22:
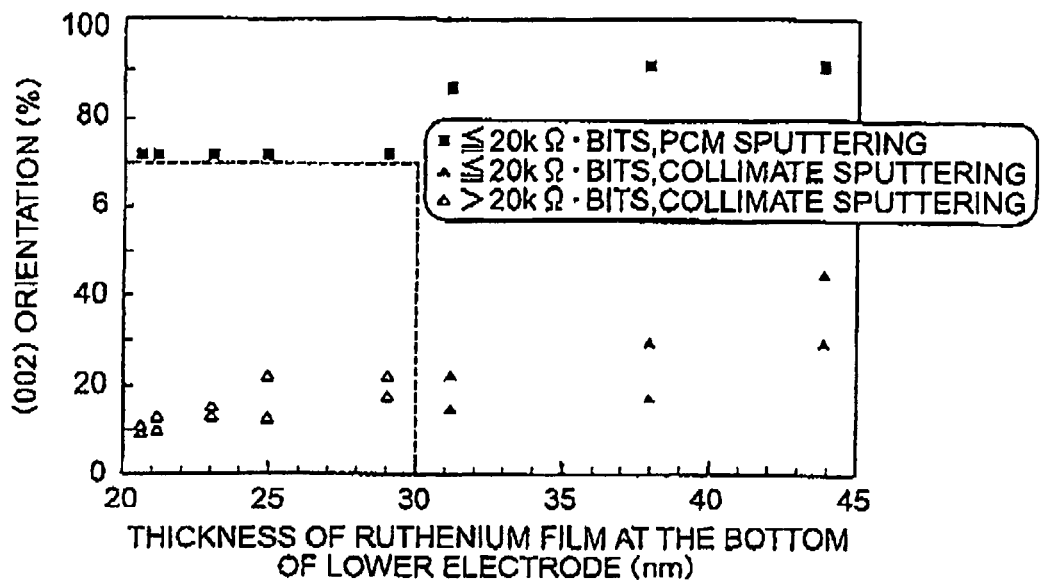
FIG. 22 is a diagram of experimental results showing the dependency of the conductive resistance on the thickness of a ruthenium film and (002) orientation.

In the definition, I(abc) means the orientation strength in the direction of (abc). Checking various sputtering types and conditions, it is found out that the conductive resistance can be expressed in association with the thickness of the ruthenium film and the (002) orientation. In FIG. 22, the white triangles indicate the conditions under which the conductive resistance becomes greater than 20 kΩ·bits, and the black rectangles and black triangles indicate the conditions under which the conductive resistance is 20 kΩ·bits or lower.

Referring to FIG. 22, in case where the thickness of the ruthenium film at the bottom portion of the lower electrode is 30 nm or greater, the conductive resistance becomes 20 kΩ·bits or lower. Even in case where the thickness of the ruthenium film at the bottom portion of the lower electrode is 30 nm or less, the conductive resistance becomes 20 kΩ·bits or lower if the (002) orientation is 70% or greater. That the conductive resistance depends on the (002) orientation can be explained from diffusion of oxygen through the grain boundary produced at the boundary between orientations. Specifically, the grain boundary of a metal layer is easily produced at the boundary of crystal orientations, so that the stronger the orientation is, the lower the grain-boundary density becomes. In this case, diffusion of oxygen through the grain boundary is repressed so that a titanium oxide film is not formed and the conductive resistance is kept low.

Figure 20:
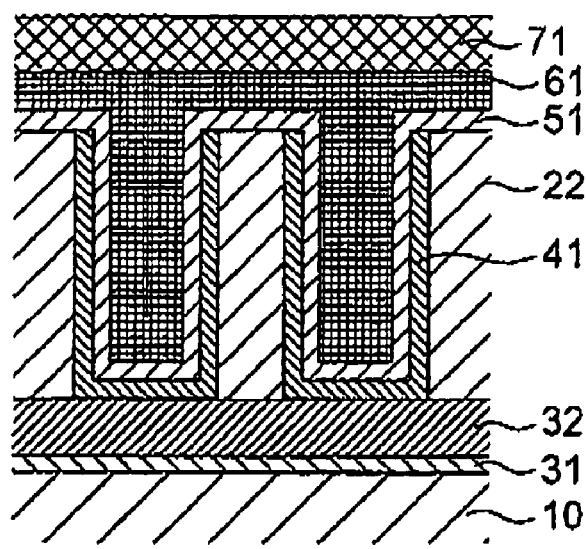
FIG. 20 is a longitudinal cross-sectional view of a sample which has undergone TEM observation of the cross section of the bottom portion of the lower electrode.

Next, the I-V characteristic of the capacitor was checked. In the check, a 274-kbit parallel array TEG with a cross-sectional structure as shown in FIG. 20 was used and the current between the barrier metal film and the upper electrode was measured by applying a voltage to the upper electrode with the potential of the barrier metal film being fixed.

Figure 23:
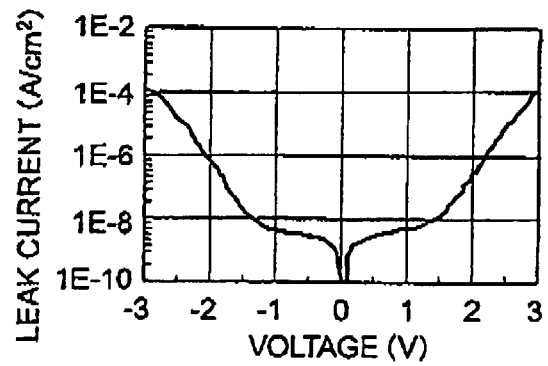
FIG. 23 is a diagram showing the I-V characteristic of a capacitor.

Checking various sputtering types and conditions, it is found out that the conditions for a small leak current coincide with the conditions for the black rectangles and black triangles in FIG. 21, while the conditions for a large leak current coincide with the conditions for the white triangles. The reference for the leak current was set to 1 e−8 A/cm$^2$ at ±1 V. FIG. 23 shows the I-V characteristic of the capacitor under the typical conditions for a small leak current (the black rectangles and the black triangles in FIG. 21).

Figure 24:
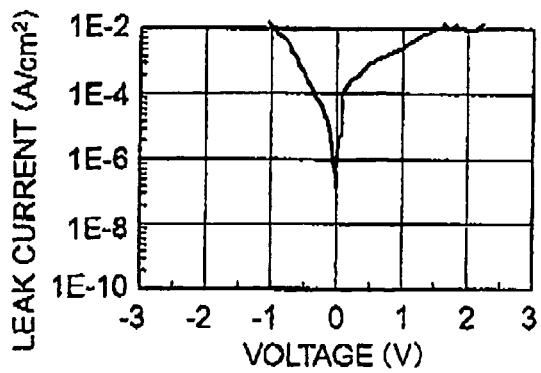
FIG. 24 is a diagram showing the I-V characteristic of a capacitor.

While this characteristic is in the case where a ruthenium film of 30 nm is formed at the bottom portion of the lower electrode by PCM sputtering (10 nm by sputtering and 20 nm by CVD), the leak current is suppressed to 1 e −9 A/cm$^2$ at ±1 V, a level which is practically sufficient. FIG. 24 shows the I-V characteristic of the capacitor under the typical conditions for a large leak current (the white triangles in FIG. 21).

While this characteristic is in the case where a ruthenium film of 30 nm is formed at the bottom portion of the lower electrode by collimate sputtering (2 nm by sputtering and 20 nm by CVD), the leak current is large. The leak current seems to have been increased because at the time the tantalum oxide film was reformed, a titanium oxide film was formed at the interface between the ruthenium film and the titanium nitride film and stress produced by volume expansion caused at the same time was applied to the tantalum oxide film.

Under the conditions of the black rectangles and the black triangles in FIG. 21, i.e., in case where the thickness of the ruthenium film at the bottom portion of the lower electrode is 30 nm or greater, or even in case where the thickness of the ruthenium film at the bottom portion of the lower electrode is 30 nm or less if the grain-boundary density is three boundaries per bit or less, there arises no problem that a titanium oxide film is formed and the leak current of the capacitor becomes sufficiently small in a practical sense.

The grain-boundary density is lower and the (002) orientation is larger in case of using PCM sputtering than the grain-boundary density and the (002) orientation in case of using collimate sputtering. This is presumably because the sputtered particles in PCM have large kinetic energy which are converted to the thermal energy of sputtered particles at the bottom portion of the lower electrode, thereby accelerating crystal growth.

Further, the heat treatment of the lower electrode 41 prior to the formation of the tantalum oxide film 51 accelerates crystal growth, thus making the grain-boundary density lower and the orientation greater. If the heat treatment is carried out in a reductive atmosphere such as hydrogen atmosphere, removing a minute amount of impurity (oxygen, carbon or so) in the lower electrode (ruthenium film) further accelerates crystal growth, thus making the effect of lowering the grain-boundary density and improving the orientation greater.

As described above, by adequately combining the use of sputtering with high ionization is used in forming the lower electrode and the heat treatment on the lower electrode in a reductive atmosphere, the formation of the titanium oxide film can be sufficiently suppressed to thereby make the leak current of the capacitor and the conductive resistance sufficiently smaller.

Second Embodiment (1) Structure

Figure 25:
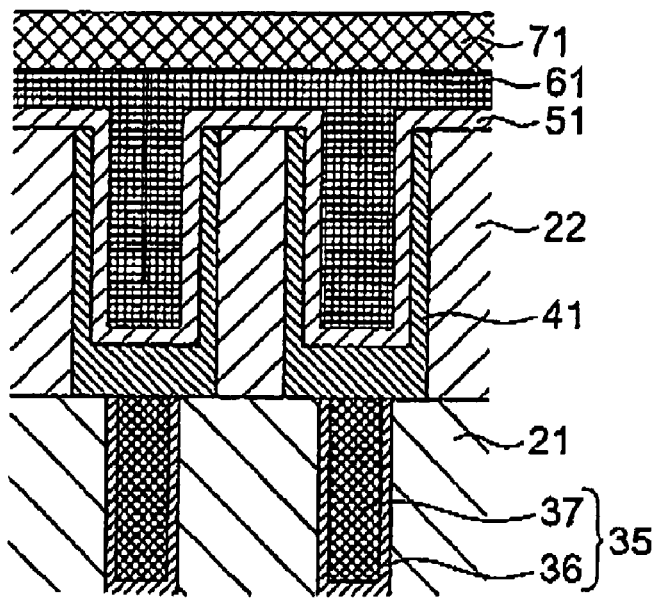
FIG. 25 is a longitudinal cross-sectional view showing illustrating a capacitor according to a second embodiment of the invention.

FIG. 25 is a longitudinal cross-sectional view showing illustrating a capacitor according to the second embodiment of the present invention. The second embodiment is an application example in which a metal plug 35 is used in place of the polysilicon plug and barrier metal film in the first embodiment (FIG. 5).

The lower electrode 41 of the capacitor according to the second embodiment is connected at its bottom to the metal plug 35 which comprises a tungsten film 37 and a titanium nitride film 36. The metal plug 35 is connected to a diffusion layer region (equivalent to "6" in FIG. 2) via an underlying polysilicon plug (equivalent to "12" in FIG. 2).

As the bottom portion of the lower electrode 41 is thick, the diffusion of oxygen is sufficiently restrained, so that even when a tungsten film which is inferior in oxidation resistance to a titanium nitride film is connected directly to the lower electrode 41, there does not arise a problem that the conductive resistance and the leak current increase due to oxidation of the metal plug. This embodiment has an advantage that the use of the metal plug 35 in place of the polysilicon plug can reduce the resistance at that portion.

(2) Fabrication Method

Figure 26:
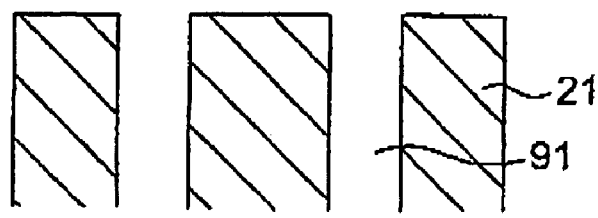
FIG. 26 is a longitudinal cross-sectional view illustrating one process of a fabrication method for the capacitor according to the second embodiment of the invention.
Figure 27:
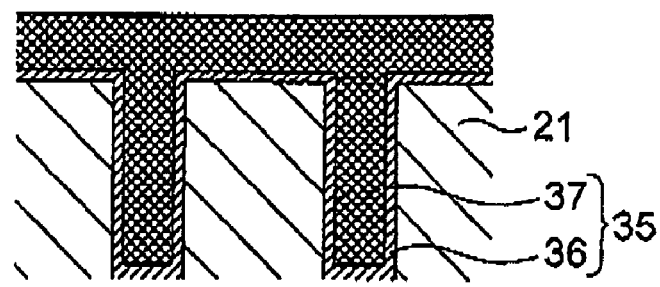
FIG. 27 is a longitudinal cross-sectional view illustrating another process of the fabrication method for the capacitor according to the second embodiment of the invention.
Figure 28:
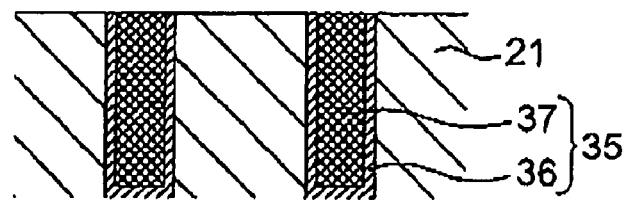
FIG. 28 is a longitudinal cross-sectional view illustrating a further process of the fabrication method for the capacitor according to the second embodiment of the invention.

A fabrication method for the capacitor shown in FIG. 25 is described using FIGS. 26 to 28.

First, the contact hole 91 is bored through the interlayer insulating film 21 (FIG. 26). The titanium nitride film 36 of 20 nm thick and the tungsten film 37 of 100 nm thick are formed in and on the contact hole 91 by CVD (FIG. 27).

Next, the ruthenium film and the tungsten film outside the contact hole are removed by CMP (FIG. 28). Thereafter, the capacitor and the upper electrode are formed according to the processes of the first embodiment, thereby completing the capacitor with the structure shown in FIG. 25.

The formation of the polysilicon film and the etch-back process thereof are eliminated in the second embodiment as compared with the first embodiment.

Third Embodiment (1) Structure

Figure 29:
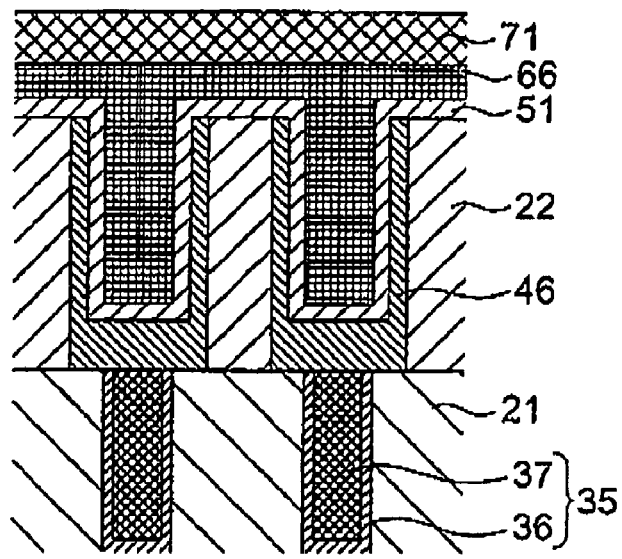
FIG. 29 is a longitudinal cross-sectional view showing illustrating a capacitor according to a third embodiment of the invention.

FIG. 29 is a longitudinal cross-sectional view showing illustrating a capacitor according to the third embodiment of the present invention. The third embodiment is an application example in which a titanium nitride film is used for the lower electrode and the upper electrode of the in the second embodiment (FIG. 25) in place of the ruthenium film.

The capacitor according to the embodiment is formed on the interlayer insulating film 21 which covers an underlying device. The capacitor is constructed by laminating a titanium nitride film 46 as the lower electrode, a titanium nitride film 66 as the upper electrode and the tantalum oxide film 51 as the capacitive insulating film in a hole provided in the interlayer insulating film 22 formed on the interlayer insulating film 21.

The lower electrode 46 of the capacitor is connected at its bottom to the metal plug 35 which comprises the tungsten film 37 and the titanium nitride film 36. The metal plug 35 is connected to a diffusion layer region (not shown) via an underlying contact metal film (not shown) and polysilicon plug (not shown).

In the case where a titanium nitride film for the lower electrode and the upper electrode, capacitance per unit electrode area is reduced as compared with the case of using a ruthenium film. This is because a titanium oxide film with a low capacitance is formed at the interface between the tantalum oxide film and the electrode. Further, a leak current is increased as compared with the case of using a ruthenium film. On the other hand, the cost of the material for the electrode can be advantageously reduced. It is therefore effective to adapt the use of the titanium nitride film to an LSI (Large Scale Integration) having a DRAM and a logic circuit (SRAM or so) mounted thereon.

As the thick bottom portion of the lower electrode 46 sufficiently suppresses the diffusion of oxygen in the third embodiment, there does not arise a problem that the conductive resistance and the leak current increase due to oxidation of the metal plug.

(2) Fabrication Method

A fabrication method for the capacitor shown in FIG. 29 is described using FIGS. 30 to 33.

First, a metal plug is formed according to the fabrication processes of the second embodiment as shown in FIGS. 26 to 28.

Next, the interlayer insulating film 22 is formed, and the cylinder hole 92 penetrating the interlayer insulating film 22 is formed to expose the top surface of the metal plug 35 at the bottom portion of the cylinder hole 92 (FIG. 30).

Figure 31:
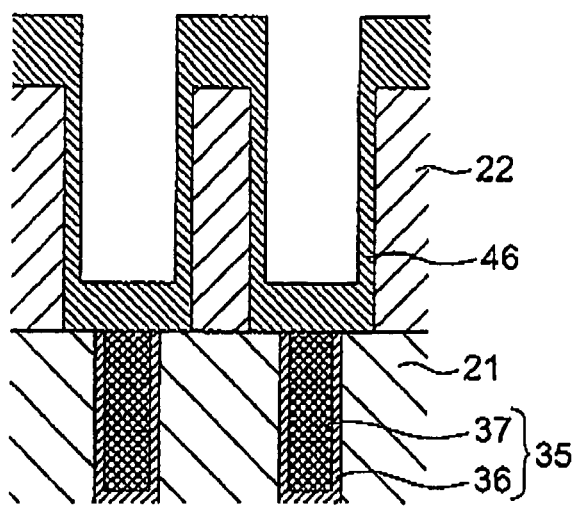
FIG. 31 is a longitudinal cross-sectional view illustrating another process of the fabrication method for the capacitor according to the third embodiment of the invention.
Figure 32:
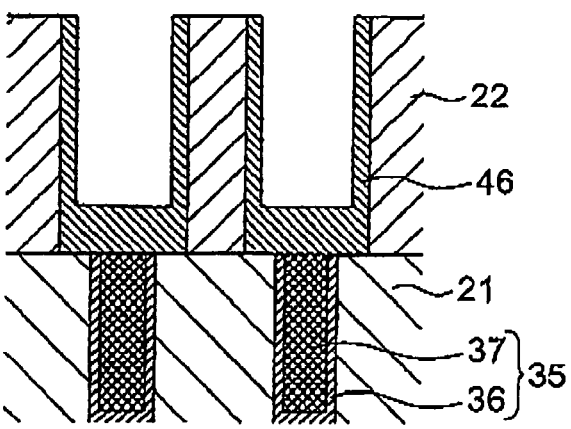
FIG. 32 is a longitudinal cross-sectional view illustrating a further process of the fabrication method for the capacitor according to the third embodiment of the invention.

Then, the titanium nitride film 46 is formed as the lower electrode by sputtering and CVD (FIG. 31). Here, a titanium nitride film of about 20 nm thick is formed on the hole by PCM sputtering first. At this time, a titanium nitride film of 10 nm is formed at the bottom portion of the hole.

Subsequently, a titanium nitride film of 20 nm thick is formed by CVD. The sputtering and CVD processes form a titanium nitride film of 30 nm thick on the hole's bottom portion and a titanium nitride film of 20 nm thick on the hole's side portion.

Next, while the titanium nitride film in the hole is protected with a photoresist film (equivalent to "99" in FIG. 12), the titanium nitride film on the hole is etched back to thereby obtain the cup-shaped lower electrode 46 (FIG. 28).

Figure 33:
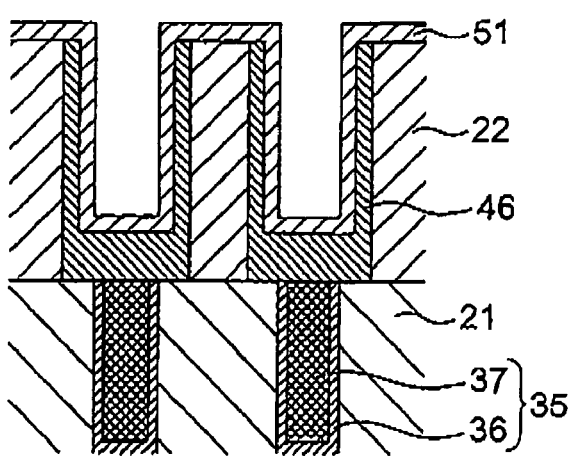
FIG. 33 is a longitudinal cross-sectional view illustrating a still further process of the fabrication method for the capacitor according to the third embodiment of the invention.

Then, the tantalum oxide film 51 of 15 nm thick is formed by CVD and a heat treatment is carried out in an ozone atmosphere at 410° C. for ten minutes in order to reform the tantalum oxide film 51 (FIG. 33). Subsequently, a titanium nitride film is formed by CVD as the upper electrode 66 on which the tungsten film 71 is formed by sputtering to reduce the resistance of the upper electrode.

The titanium nitride film 66 and the tungsten film 71 are processed into a desired upper electrode pattern by photolithography and dry etching, thereby completing the capacitor with the structure shown in FIG. 29.

Fourth Embodiment (1) Structure

Figure 34:
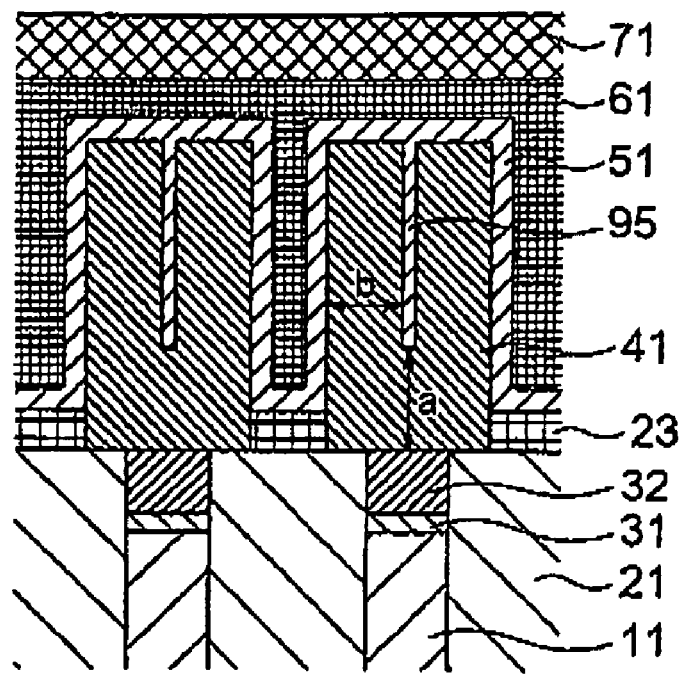
FIG. 34 is a longitudinal cross-sectional view showing illustrating a capacitor according to a fourth embodiment of the invention.

FIG. 34 is a longitudinal cross-sectional view showing illustrating a capacitor according to the fourth embodiment of the invention. The fourth embodiment is an application example in which the lower electrode has a structure different from that in the first embodiment (FIG. 5).

In this embodiment, the capacitor is constructed by laminating the ruthenium film 41 with a pedestal (columnar)

structure as the lower electrode, the ruthenium film 61 as the upper electrode and the tantalum oxide film 51 as the capacitive insulating film.

The lower electrode 41 is connected at its bottom to a barrier metal film 32 which is connected at its bottom surface to a polysilicon plug 11 via a contact metal film 31. The polysilicon plug 11 is further connected to a diffusion layer region (equivalent to "6" in FIG. 2) via an underlying polysilicon plug (equivalent to "12" in FIG. 2).

In the embodiment, the lower electrode 41 has a cavity 95 that is always formed when a film with which the cylinder hole is buried by CVD is used as the lower electrode. At the time of reforming the tantalum oxide film 51, oxygen is diffused from the distal end of the cavity 95 toward the barrier metal film 32, penetrating through the lower electrode.

According to the embodiment, therefore, increases in leak current and conductive resistance can be expressed in association with the distance from the distal end of the cavity 95 to the barrier metal film, the density of the grain boundary extending from the distal end of the cavity to the barrier metal film and the orientation of the bottom portion of the lower electrode. The leak current and the conductive resistance that have been discussed in the foregoing description of the first embodiment can be applied to the fourth embodiment if one reads "the thickness of the lower electrode" as "the distance from the distal end of the cavity of the lower electrode" and "the density of the grain boundary penetrating the lower electrode film in the direction of thickness" as "the density of the grain boundary extending from the distal end of the cavity to the barrier metal film".

Specifically, in case where the distance from the distal end of the cavity 95 to the barrier metal film 32 (a in FIG. 34) is 30 nm or greater, or the grain-boundary density at that portion is three boundaries or less, or the (002) orientation is 70% or greater, problems that the leak current of the capacitor increases and the conductive resistance of the lower electrode and barrier metal film increases do not arise.

(2) Fabrication Method

Figure 9:
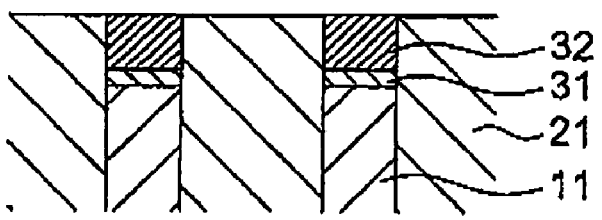
FIG. 9 is a longitudinal cross-sectional view illustrating a still further process of the fabrication method for the capacitor according to the first embodiment of the invention.

A fabrication method for the capacitor shown in FIG. 34 is described using FIGS. 35 to 39. First, the polysilicon plug 11 and the barrier metal film 32 are formed according to the fabrication processes of the first embodiment as shown in FIGS. 6 to 9 (FIG. 9).

Figure 35:
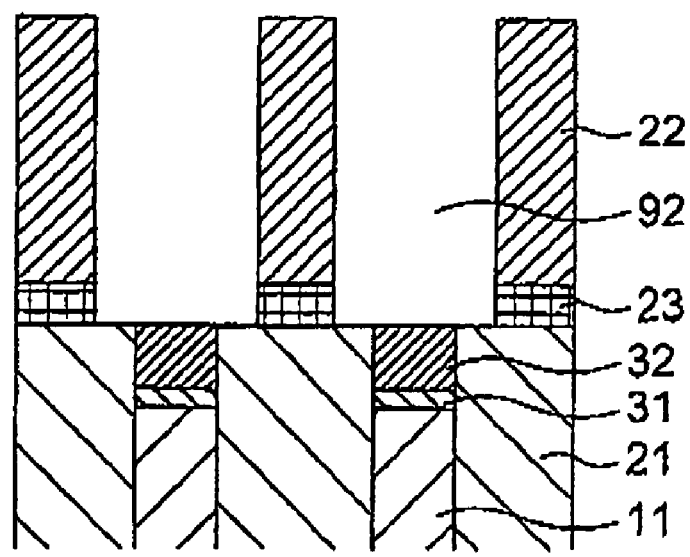
FIG. 35 is a longitudinal cross-sectional view illustrating one process of a fabrication method for the capacitor according to the fourth embodiment of the invention.

Then, an interlayer insulating film 23 and the interlayer insulating film 22 are formed in order, and the cylinder hole 92 which penetrates the interlayer insulating films 23 and 22 is formed to expose the top surface of the barrier metal film 32 at the bottom portion of the cylinder hole 92 (FIG. 35).

Figure 36:
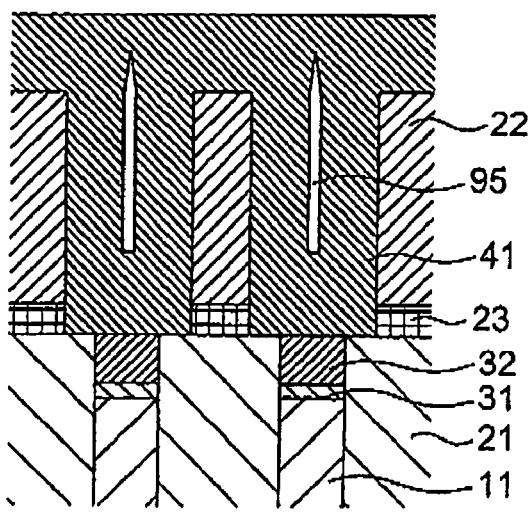
FIG. 36 is a longitudinal cross-sectional view illustrating another process of the fabrication method for the capacitor according to the fourth embodiment of the invention.
Figure 37:
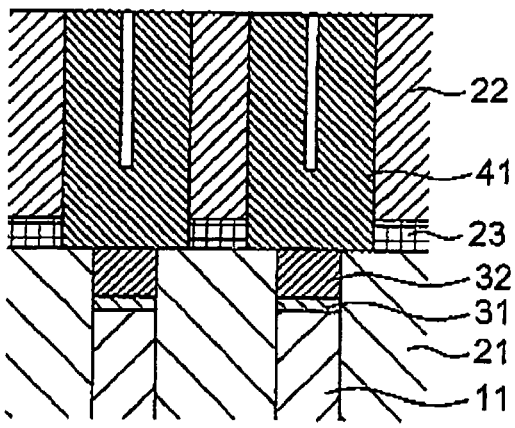
FIG. 37 is a longitudinal cross-sectional view illustrating a further process of the fabrication method for the capacitor according to the fourth embodiment of the invention.

Next, the ruthenium film 41 is formed as the lower electrode by sputtering and CVD (FIG. 36). In this process, first, a ruthenium film of 20 nm thick is formed on the hole by PCM sputtering. At this time, a ruthenium film of 10 nm thick is formed on the bottom portion of the hole and a very thin (<1 nm) ruthenium film is formed on the side portion of the hole. Then, a ruthenium film is formed by CVD. In this event, a thin ruthenium film formed on the hole's side portion by sputtering serves as a seed layer and a ruthenium film of 70 nm thick is uniformly grown on the hole and the side portion and bottom portion of the hole. The distance from the distal end of the cavity 95, formed in the center portion of the ruthenium film, to the top surface of the barrier metal film 32 became 30 nm or greater.

Figure 38:
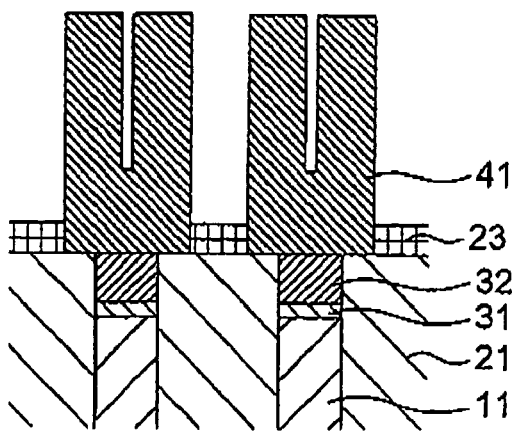
FIG. 38 is a longitudinal cross-sectional view illustrating a still further process of the fabrication method for the capacitor according to the fourth embodiment of the invention.

Next, the ruthenium film on the hole is removed by CMP (FIG. 37) and the interlayer insulating film 22 is removed by wet etching (FIG. 37), obtaining the lower electrode with a pedestal (columnar) shape (FIG. 38). Then, a heat treatment is carried out in a hydrogen atmosphere (nitrogen dilution of 20%) in order to improve the orientation of the ruthenium film 41.

Figure 39:
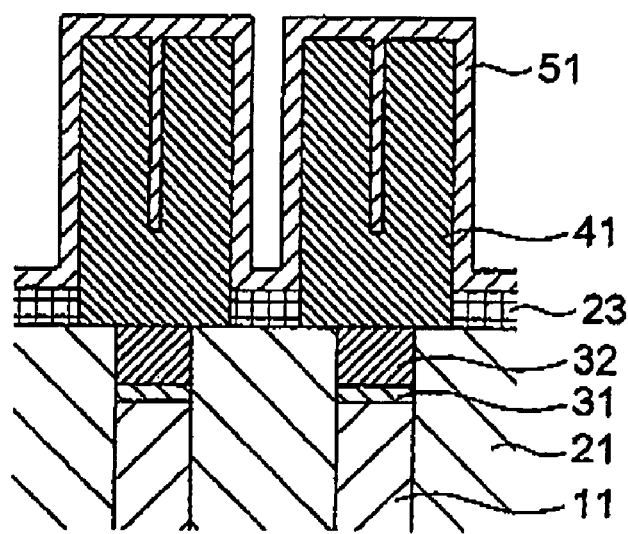
FIG. 39 is a longitudinal cross-sectional view illustrating a yet still further process of the fabrication method for the capacitor according to the fourth embodiment of the invention.

Next, the tantalum oxide film 51 of 15 nm thick is formed by CVD and a heat treatment is performed in an ozone atmosphere at 410° C. for 10 minutes in order to reform the tantalum oxide film 51 (FIG. 39). Then, the ruthenium film 61 is formed as the upper electrode by sputtering and CVD, and the tungsten film 71 is formed on the ruthenium film 61 by sputtering to reduce the resistance of the upper electrode. The ruthenium film 61 and the tungsten film 71 are processed into a desired upper electrode pattern by photolithography and dry etching, thereby completing the capacitor with the structure shown in FIG. 34.

Fifth Embodiment (1) Structure

Figure 40:
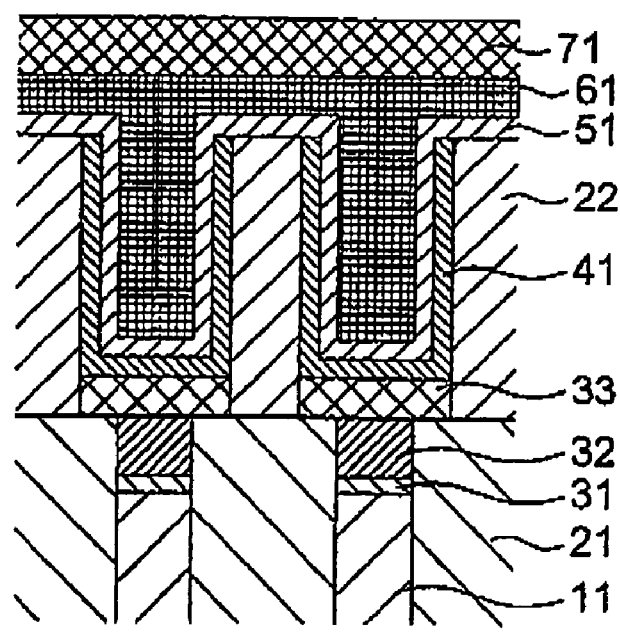
FIG. 40 is a longitudinal cross-sectional view showing illustrating a capacitor according to a fifth embodiment of the invention.
Figure 41:
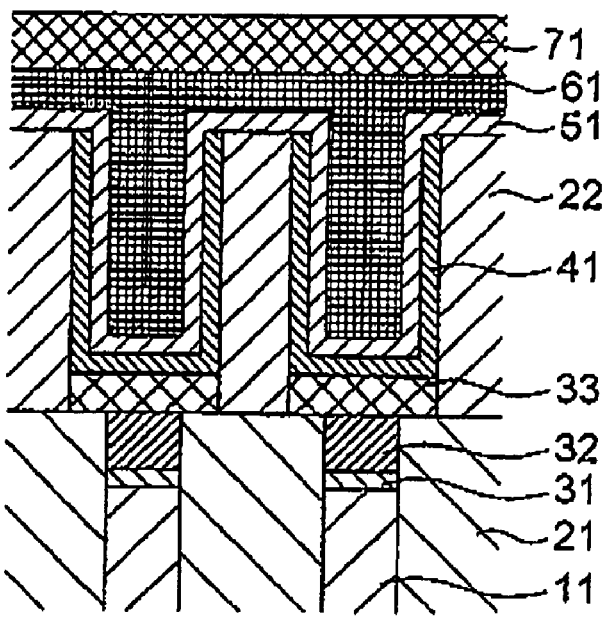
FIG. 41 is a longitudinal cross-sectional view showing illustrating the capacitor according to the fifth embodiment of the invention.

FIG. 40 is a longitudinal cross-sectional view showing illustrating a capacitor according to the fifth embodiment of the invention.

In this embodiment, the capacitor is constructed by laminating the ruthenium film 41 with a pedestal (columnar) structure as the lower electrode, the ruthenium film 61 as the upper electrode and the tantalum oxide film 51 as the capacitive insulating film in a hole provided in the interlayer insulating film 22. A second barrier metal film 33 is provided on the lower electrode 41 in contact with the first barrier metal film 32.

The first barrier metal film 32 is connected at its bottom surface to the polysilicon plug 11 via the contact metal film 31, and the polysilicon plug 11 is further connected to a diffusion layer region (equivalent to "6" in FIG. 2) via an underlying polysilicon plug (equivalent to "12" in FIG. 2), in the manner similar to the first embodiment.

The conductive resistance is inversely proportional to the area at which metal materials of different kinds, i.e., the ruthenium film (lower electrode) and the titanium nitride film (barrier metal film), contact each other. In the embodiment, the area of the contact portion between the ruthenium film and the titanium nitride film is large, which reduces the conductive resistance of the lower electrode and the barrier metal film, as compared with the first embodiment.

The fifth embodiment has an another advantage that the conductive resistance is not easily influenced by layer misalignment between the barrier metal film and the capacitor in the photolithography process. The fifth embodiment has a further advantage that the barrier metal film that contacts the lower electrode has a lower conductive resistance when it is formed by sputtering. This is because the barrier metal film formed by CVD (e.g., in case of a titanium nitride film) contains an impurity, such as chlorine or oxygen, the impurity is likely to form an oxide film (titanium oxide film).

Adapting the first embodiment or the second embodiment to the structure in FIG. 40 advantageously further reduces the conductive resistance of the lower electrode and the barrier metal film.

(2) Fabrication Method

Figure 42:
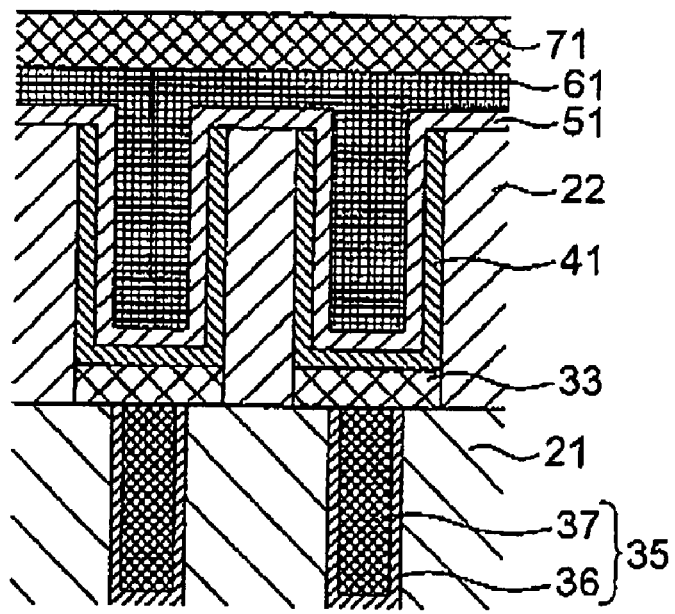
FIG. 42 is a longitudinal cross-sectional view showing illustrating the capacitor according to the fifth embodiment of the invention.

A fabrication method for the capacitor shown in FIG. 42 is described using FIGS. 42 to 47.

First, the polysilicon plug 11 and the first barrier metal film 32 are formed according to the fabrication processes of the first embodiment as shown in FIGS. 6 to 9 (FIG. 9).

Figure 43:
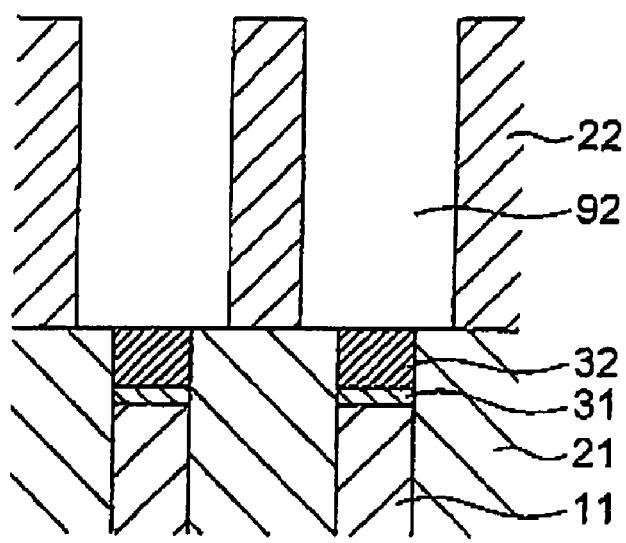
FIG. 43 is a longitudinal cross-sectional view illustrating one process of a fabrication method for the capacitor according to the fifth embodiment of the invention.

Next, the interlayer insulating film 22 is formed and the cylinder hole 92 which penetrates the interlayer insulating film 22 is formed to expose the top surface of the first barrier metal film 32 at the bottom portion of the cylinder hole 92 (FIG. 43).

Figure 44:
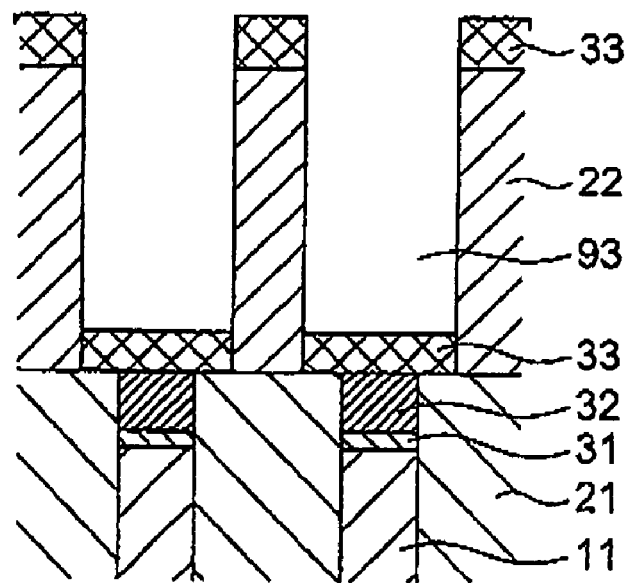
FIG. 44 is a longitudinal cross-sectional view illustrating another process of the fabrication method for the capacitor according to the fifth embodiment of the invention.

Then, the ruthenium film 33 of 20 nm thick is formed on the hole by PCM sputtering. At this time, a ruthenium film of 10 nm thick is formed on the bottom portion of the hole and a very thin ruthenium film (<1 nm; not shown)) is formed on the side portion of the hole (FIG. 44). Then, the ruthenium film 41 is formed as the lower electrode by sputtering and CVD (FIG. 45).

In this process, first, a ruthenium film of 20 nm thick is formed on the hole by PCM sputtering. At this time, a ruthenium film of 10 nm thick is formed on the bottom portion of the hole and a very thin (<1 nm) ruthenium film is formed on the side portion of the hole. Then, a ruthenium film is formed by CVD. In this event, a thin ruthenium film formed on the hole's side portion by sputtering serves as a seed layer and a ruthenium film of 20 nm thick is uniformly grown on the hole and the side portion and bottom portion of the hole. The sputtering and CVD form a ruthenium film of 30 nm thick on the bottom portion of the hole and a ruthenium film of 20 nm thick on the side portion thereof.

Next, while the ruthenium film in the hole is protected with a photoresist removed film (equivalent to "99" in FIG. 12), the ruthenium film and the titanium nitride film on the hole are etched back, obtaining the cup-shaped lower electrode (FIG. 44). Then, a heat treatment is carried out in a hydrogen atmosphere (nitrogen dilution of 20%) in order to improve the orientation of the ruthenium film 41.

Figure 45:
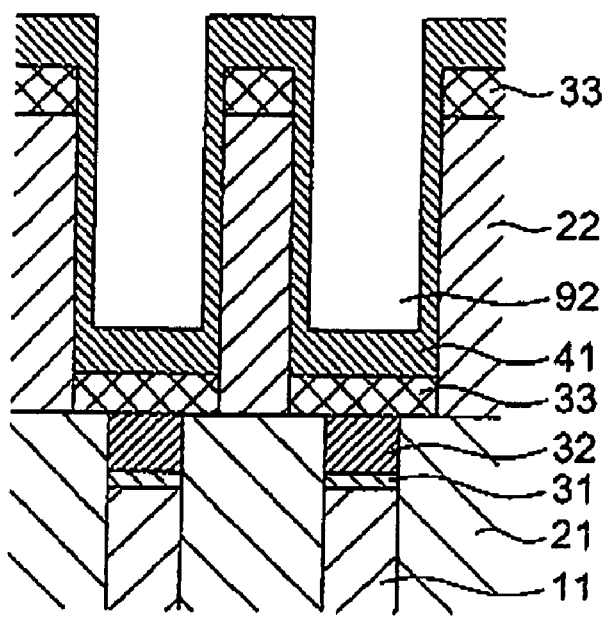
FIG. 45 is a longitudinal cross-sectional view illustrating a further process of the fabrication method for the capacitor according to the fifth embodiment of the invention.
Figure 46:
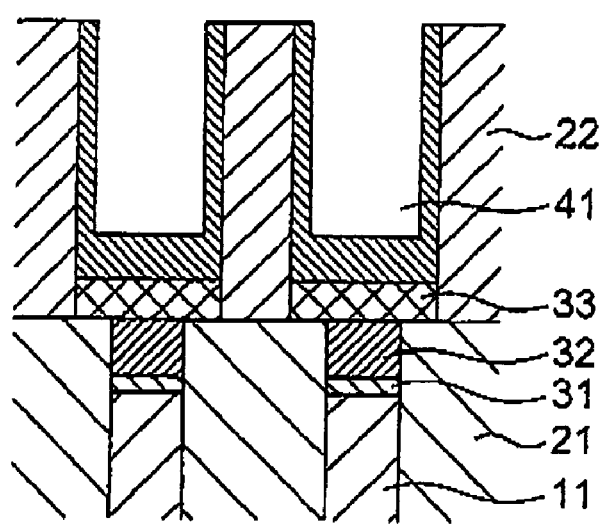
FIG. 46 is a longitudinal cross-sectional view illustrating a still further process of the fabrication method for the capacitor according to the fifth embodiment of the invention.
Figure 47:
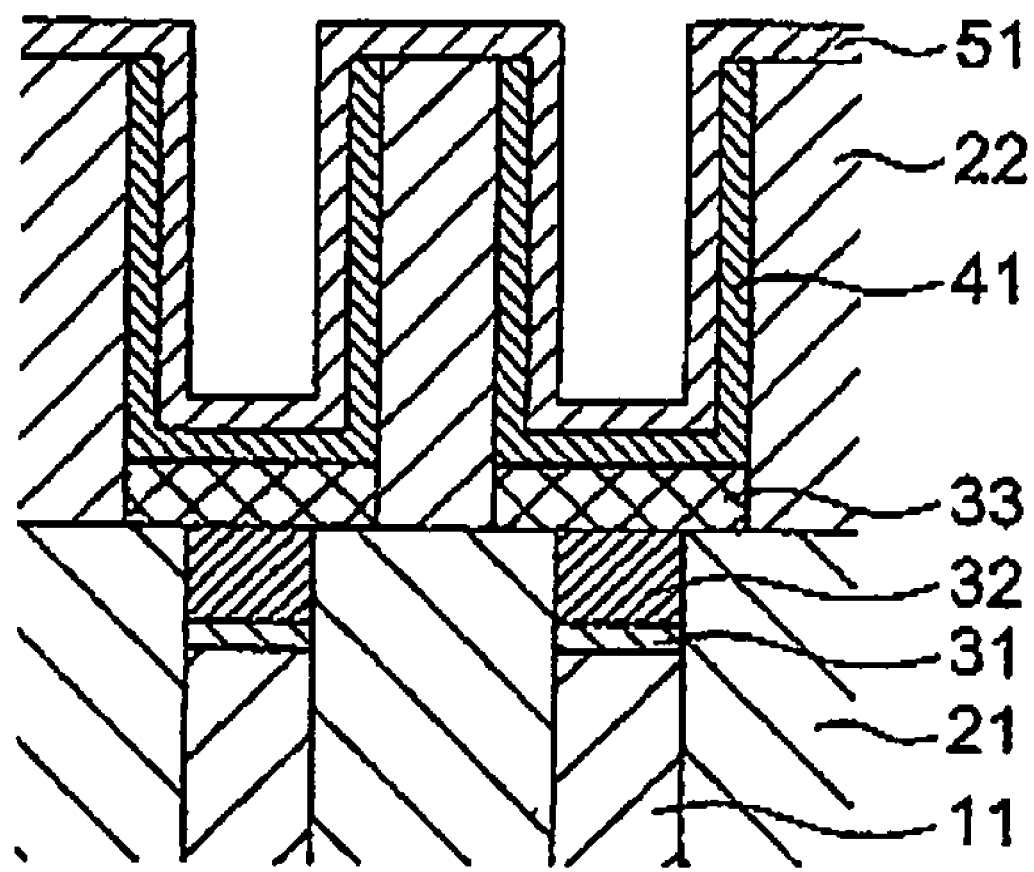
FIG. 47 is a longitudinal cross-sectional view illustrating a yet still further process of the fabrication method for the capacitor according to the fifth embodiment of the invention.

Next, the tantalum oxide film 51 of 15 nm thick is formed by CVD and a heat treatment is performed in an ozone atmosphere at 410° C. for 10 minutes in order to reform the tantalum oxide film 51 (FIG. 45). At this time, the titanium nitride film which is exposed slightly through the head portion of the lower electrode is transformed to titanium oxide. Subsequently, the ruthenium film 61 is formed as the upper electrode by sputtering and CVD, and the tungsten film 71 is formed on the ruthenium film 61 by sputtering to reduce the resistance of the upper electrode. The ruthenium film 61 and the tungsten film 71 are processed into a desired upper electrode pattern by photolithography and dry etching, thereby completing the capacitor with the structure shown in FIG. 42.

Although a titanium nitride film is used as the second barrier metal film 33 in the embodiment, a tantalum nitride film can be used instead. In this case, the leak current of the capacitor can be reduced more than that in the case of using the titanium nitride film for the following reason.

In the fifth embodiment, at the time of performing a heat treatment to reform the tantalum oxide film 51 (FIG. 45), the titanium nitride film exposed through the head portion of the lower electrode is transformed to an titanium oxide film, producing a portion where the titanium oxide film directly contacts the capacitive insulating film (tantalum oxide film 51). At this portion, oxygen is likely to move from the tantalum oxide film 51 to the titanium oxide film (because tantalum is oxidized more easily than titanium), so that oxygen deficiency which has occurred in the tantalum oxide film increases the leak current. In case where a tantalum nitride film is used as the second barrier metal film 33, on the other hand, the aforementioned movement of oxygen is hard to occur, so that the leak current does not increase.

Although the second barrier metal film (titanium nitride film) 33 and the ruthenium film 41 of the lower electrode are etched back simultaneously in the fifth embodiment, the second barrier metal film 33 alone may be etched back after the formation of the second barrier metal film 331 then the ruthenium film 41 of the lower electrode may be formed after which the ruthenium film 41 alone may be etched back. In this case, while the number of processes is increased, it is possible to prevent the production of that portion of the heat portion of the lower electrode where the titanium oxide film directly contacts the tantalum oxide film, thereby reducing the leak current.

The invention is not limited to the above-described embodiments but can obviously be modified as needed within the scope of the technical concept.

The invention has such a first advantage as to be able to make the bottom portion of the lower electrode of an MIM type capacitor thicker ($\geq 30$ nm) than the side portion, make the grain-boundary density equal to or lower than 3 boundaries per bit and make the orientation equal to or greater than 70% while securing an alignment margin without particularly increasing the number of fabrication processes.

The first advantage of the invention brings about a second advantage that the leak current of the MIM type capacitor and the conductive resistance of the lower electrode and the barrier metal film can be reduced.

The second advantage of the invention leads to such a third advantage as to be able to improve the reliability of the MIM type capacitor and the operational speed of a DRAM.

The first advantage of the invention also leads to a fourth advantage that memory cells can be further microfabricated.

The fourth advantage of the invention brings about such a fifth advantage as to make the chip size of semiconductor devices of the same capacity smaller.

What is claimed is:

1. A semiconductor device comprising memory cells each having an MISFET for memory selection formed on a major surface of a semiconductor substrate and a capacitive element comprised of a lower electrode electrically connected at a bottom portion to one of a source and drain of said MISFET for memory selection via a first metal layer and an upper electrode formed on said lower electrode via a capacitive insulating film, wherein said lower electrode has a cup shape-provided along a side wall portion and a bottom portion of a hole provided in an interlayer insulating film and has a thickness of 30 nm or greater at the bottom portion of said lower electrode and a thickness of less than 30 nm at a side wall portion of said lower electrode.

2. The semiconductor device according to claim 1, wherein said lower electrode is a metal film.

3. The semiconductor device according to claim 1, wherein said lower electrode is a ruthenium film.

4. The semiconductor device according to claim 1, wherein said capacitive insulating film is a tantalum oxide film.

5. The semiconductor device according to claim 1, wherein said upper electrode is a ruthenium film.

6. The semiconductor device according to claim 1, wherein said first metal layer is a titanium nitride film.

7. A semiconductor device comprising memory cells each having an MISFET for memory selection formed on a major surface of a semiconductor substrate and a capacitive element comprised of a lower electrode electrically connected at a bottom portion to one of a source and drain of said MISFET for memory selection via a first metal layer and a second metal layer and an upper electrode formed on said lower electrode via a capacitive insulating film, wherein said lower electrode has a cup shape provided along a side wall portion and a bottom portion of a hole provided in an interlayer insulating film, said first metal layer and said second metal layer partly contact each other, said lower electrode is connected at an entire bottom of said lower electrode to said second metal layer and said lower electrode has a thickness of 30 nm or greater at the bottom portion of said lower electrode and a thickness of less than 30 nm at a side wall portion of said lower electrode.

8. The semiconductor device according to claim 7, wherein said lower electrode is a metal film.

9. The semiconductor device according to claim 7, wherein said lower electrode is a ruthenium film.

10. The semiconductor device according to claim 7, wherein said capacitive insulating film is a tantalum oxide film.

11. The semiconductor device according to claim 7, wherein said upper electrode is a ruthenium film.

12. The semiconductor device according to claim 7, wherein said first metal layer is a titanium nitride film.

* * * * *